US012107072B2

(12) United States Patent
Archer et al.

(10) Patent No.: US 12,107,072 B2
(45) Date of Patent: Oct. 1, 2024

(54) DISPLAY BACKPLANE INCLUDING AN ARRAY OF TILES

(71) Applicant: GOOGLE LLC, Mountain View, CA (US)

(72) Inventors: Melissa Archer, San Jose, CA (US); Gang He, Cupertino, CA (US)

(73) Assignee: GOOGLE LLC, Mountain View, CA (US)

( * ) Notice: Subject to any disclaimer, the term of this patent is extended or adjusted under 35 U.S.C. 154(b) by 615 days.

(21) Appl. No.: 17/223,299

(22) Filed: Apr. 6, 2021

(65) Prior Publication Data
US 2021/0313298 A1 Oct. 7, 2021

Related U.S. Application Data

(60) Provisional application No. 63/005,731, filed on Apr. 6, 2020.

(51) Int. Cl.
H01L 29/18 (2006.01)
G02B 26/08 (2006.01)
(Continued)

(52) U.S. Cl.
CPC ...... H01L 25/0655 (2013.01); G02B 26/0833 (2013.01); H01L 25/167 (2013.01)

(58) Field of Classification Search
CPC ... H01L 25/0655; H01L 25/167; H01L 33/62; H01L 25/0753; H01L 33/58; H01L 23/29;
(Continued)

(56) References Cited

U.S. PATENT DOCUMENTS 2,403,731 A 7/1946 Macneille
3,936,817 A 2/1976 Levy et al.
(Continued)

FOREIGN PATENT DOCUMENTS

CN 104221071 A 12/2014
EP 0658870 A2 6/1995
(Continued)

OTHER PUBLICATIONS

International Application No. PCT/US2021/025881, Search Report and Written Opinion dated Jul. 16, 2021, 15 pages.
(Continued)

Primary Examiner — Ismail A Muse
(74) Attorney, Agent, or Firm — Brake Hughes Bellermann LLP

(57) ABSTRACT

A backplane for controlling a display is disclosed. The backplane includes a plurality of tiles formed into an array. Each of the plurality of tiles includes a plurality of complementary metal-oxide-semiconductor backplane dies. Edges of the backplane dies that form a perimeter of the array include electrical connections that direct electrical signals to at least one of the CMOS backplane dies. A display assembly is also disclosed wherein the display assembly includes a backplane having an array of tiles. Each tile includes a plurality of electrically coupled CMOS backplane dies, where edges of the tiles that form an outer perimeter of the array include electrical connections directing electrical signals to one or more of the plurality of CMOS backplane dies. The display assembly further includes at least one light emitting diode array electrically coupled with at least one tile.

20 Claims, 27 Drawing Sheets

(51) Int. Cl.
*H01L 25/065* (2023.01)
*H01L 25/16* (2023.01)
*H01L 33/00* (2010.01)

(58) Field of Classification Search
CPC ... H01L 23/3185; H01L 24/07; H01L 27/156; H01L 2224/02381; G02B 26/0833; G02B 3/0056; G02B 27/0075
See application file for complete search history.

(56) References Cited

U.S. PATENT DOCUMENTS

| | | | |
|---|---|---|---|
| 4,432,610 A | 2/1984 | Kobayashi et al. |
| 1,825,201 A | 4/1989 | Watanabe et al. |
| 4,923,285 A | 5/1990 | Ogino et al. |
| 4,996,523 A | 2/1991 | Bell et al. |
| 5,018,838 A | 5/1991 | Barnes et al. |
| 5,144,418 A | 9/1992 | Brown et al. |
| 5,157,387 A | 10/1992 | Momose et al. |
| 5,189,406 A | 2/1993 | Humphries et al. |
| 5,317,334 A | 5/1994 | Sano |
| 5,359,342 A | 10/1994 | Nakai et al. |
| 5,471,225 A | 11/1995 | Parks |
| 5,473,338 A | 12/1995 | Prince et al. |
| 5,497,172 A | 3/1996 | Doherty et al. |
| 5,537,128 A | 7/1996 | Keene et al. |
| 5,548,347 A | 8/1996 | Melnik et al. |
| 5,566,010 A | 10/1996 | Ishii et al. |
| 5,602,559 A | 2/1997 | Kimura |
| 5,619,228 A | 4/1997 | Doherty |
| 5,731,802 A | 3/1998 | Aras et al. |
| 5,751,264 A | 5/1998 | Cavallerano et al. |
| 5,767,832 A | 6/1998 | Koyama et al. |
| 5,818,413 A | 10/1998 | Hayashi et al. |
| 5,905,482 A | 5/1999 | Hughes et al. |
| 5,926,158 A | 7/1999 | Yoneda et al. |
| 5,926,162 A | 7/1999 | Wood et al. |
| 5,936,603 A | 8/1999 | Lippmann et al. |
| 5,936,604 A | 8/1999 | Endou |
| 5,945,972 A | 8/1999 | Okumura et al. |
| 5,959,598 A | 9/1999 | McKnight |
| 5,969,512 A | 10/1999 | Matsuyama |
| 5,969,701 A | 10/1999 | Numao et al. |
| 5,986,640 A | 11/1999 | Baldwin et al. |
| 6,005,558 A | 12/1999 | Hudson et al. |
| 6,005,649 A | 12/1999 | Krusius |
| 6,034,659 A | 3/2000 | Wald et al. |
| 6,046,716 A | 4/2000 | McKnight |
| 6,067,065 A | 5/2000 | Worley et al. |
| 6,121,948 A | 9/2000 | Worley et al. |
| 6,127,991 A | 10/2000 | Uehara et al. |
| 6,128,054 A | 10/2000 | Schwarzenberger |
| 6,144,356 A | 11/2000 | Weatherford et al. |
| 6,151,011 A | 11/2000 | Worley et al. |
| RE37,056 E | 2/2001 | Wortel et al. |
| 6,201,521 B1 | 3/2001 | Doherty |
| 6,262,703 B1 | 7/2001 | Perner |
| 6,285,360 B1 | 9/2001 | Li |
| 6,297,788 B1 | 10/2001 | Shigeta et al. |
| 6,317,112 B1 | 11/2001 | Handschy et al. |
| 6,369,782 B2 | 4/2002 | Shigeta |
| 6,424,330 B1 | 7/2002 | Johnson |
| 6,456,267 B1 | 9/2002 | Sato et al. |
| 6,476,792 B2 | 11/2002 | Hattori et al. |
| 6,518,945 B1 | 2/2003 | Pinkham |
| 6,567,138 B1 | 5/2003 | Krusius et al. |
| 6,587,084 B1 | 7/2003 | Alymov et al. |
| 6,603,452 B1 | 8/2003 | Serita |
| 6,621,488 B1 | 9/2003 | Takeuchi et al. |
| 6,690,432 B2 | 2/2004 | Janssen et al. |
| 6,717,561 B1 | 4/2004 | Pfeiffer et al. |
| 6,731,306 B2 | 5/2004 | Booth et al. |
| 6,744,415 B2 | 6/2004 | Waterman et al. |
| 6,762,739 B2 | 7/2004 | Bone |
| 6,784,898 B2 | 8/2004 | Lee et al. |
| 6,788,231 B1 | 9/2004 | Hsueh |
| 6,806,871 B1 | 10/2004 | Yasue |
| 6,831,626 B2 | 12/2004 | Nakamura et al. |
| 6,850,216 B2 | 2/2005 | Akimoto et al. |
| 6,862,012 B1 | 3/2005 | Funakoshi et al. |
| 6,924,824 B2 | 8/2005 | Adachi et al. |
| 6,930,667 B1 | 8/2005 | Ijima et al. |
| 6,930,692 B1 | 8/2005 | Coker et al. |
| 7,066,605 B2 | 6/2006 | Dewald et al. |
| 7,067,853 B1 | 6/2006 | Yao |
| 7,088,325 B2 | 8/2006 | Ishii |
| 7,088,329 B2 | 8/2006 | Hudson |
| 7,129,920 B2 | 10/2006 | Chow |
| 7,187,355 B2 | 3/2007 | Tam et al. |
| 7,379,043 B2 | 5/2008 | Worley et al. |
| 7,397,980 B2 | 7/2008 | Frisken |
| 7,443,374 B2 | 10/2008 | Hudson |
| 7,468,717 B2 | 12/2008 | Hudson |
| 7,692,671 B2 | 4/2010 | Ng |
| 7,852,307 B2 | 12/2010 | Hudson |
| 7,990,353 B2 | 8/2011 | Chow |
| 8,040,311 B2 | 10/2011 | Hudson et al. |
| 8,111,271 B2 | 2/2012 | Hudson et al. |
| 8,264,507 B2 | 9/2012 | Hudson et al. |
| 8,421,828 B2 | 4/2013 | Hudson et al. |
| 8,643,681 B2 | 2/2014 | Endo et al. |
| 9,047,818 B1 | 6/2015 | Day et al. |
| 9,117,746 B1 | 8/2015 | Clark et al. |
| 9,406,269 B2 | 8/2016 | Lo et al. |
| 9,583,031 B2 | 2/2017 | Hudson et al. |
| 9,646,562 B1 | 5/2017 | Lee et al. |
| 9,824,619 B2 | 11/2017 | Hudson et al. |
| 9,918,053 B2 | 3/2018 | Lo et al. |
| 10,128,308 B1 | 11/2018 | Shin et al. |
| 10,437,402 B1 | 10/2019 | Pan |
| 10,784,241 B2 | 9/2020 | Chang et al. |
| 10,957,272 B2 | 3/2021 | Li et al. |
| 11,385,473 B2 | 7/2022 | Balogh |
| 2001/0013844 A1 | 8/2001 | Shigeta |
| 2002/0001051 A1 | 1/2002 | Krusius et al. |
| 2002/0024481 A1 | 2/2002 | Kawabe et al. |
| 2002/0041266 A1 | 4/2002 | Koyama et al. |
| 2002/0043610 A1 | 4/2002 | Lee et al. |
| 2002/0135309 A1 | 9/2002 | Okuda |
| 2002/0140662 A1 | 10/2002 | Igarashi |
| 2002/0158825 A1 | 10/2002 | Endo et al. |
| 2003/0058195 A1 | 3/2003 | Adachi et al. |
| 2003/0156102 A1 | 8/2003 | Kimura |
| 2003/0174117 A1 | 9/2003 | Crossland et al. |
| 2003/0210257 A1 | 11/2003 | Hudson et al. |
| 2004/0032636 A1 | 2/2004 | Willis |
| 2004/0080482 A1 | 4/2004 | Magendanz et al. |
| 2004/0125090 A1 | 7/2004 | Hudson |
| 2004/0174328 A1 | 9/2004 | Hudson |
| 2004/0233539 A1* | 11/2004 | Harwit ............ G02B 3/0056 359/619 |
| 2005/0001794 A1 | 1/2005 | Nakanishi et al. |
| 2005/0001806 A1 | 1/2005 | Ohmura |
| 2005/0052437 A1 | 3/2005 | Hudson |
| 2005/0057466 A1 | 3/2005 | Sala et al. |
| 2005/0062765 A1 | 3/2005 | Hudson |
| 2005/0088462 A1 | 4/2005 | Borel |
| 2005/0195894 A1 | 9/2005 | Kim et al. |
| 2005/0200300 A1 | 9/2005 | Yumoto |
| 2005/0264586 A1 | 12/2005 | Kim |
| 2006/0012589 A1 | 1/2006 | Hsieh et al. |
| 2006/0012594 A1 | 1/2006 | Worley et al. |
| 2006/0066645 A1 | 3/2006 | Ng |
| 2006/0147146 A1 | 7/2006 | Voigt et al. |
| 2006/0208961 A1 | 9/2006 | Nathan et al. |
| 2006/0284903 A1 | 12/2006 | Ng |
| 2006/0284904 A1 | 12/2006 | Ng |
| 2007/0252855 A1 | 11/2007 | Hudson |
| 2007/0252856 A1 | 11/2007 | Hudson et al. |
| 2008/0007576 A1 | 1/2008 | Ishii et al. |
| 2008/0088613 A1 | 4/2008 | Hudson et al. |
| 2008/0158437 A1 | 7/2008 | Arai et al. |
| 2008/0259019 A1 | 10/2008 | Ng |
| 2009/0027360 A1 | 1/2009 | Kwan et al. |

(56) References Cited

U.S. PATENT DOCUMENTS

| | | |
|---|---|---|
| 2009/0027364 A1 | 1/2009 | Kwan et al. |
| 2009/0115703 A1 | 5/2009 | Cok |
| 2009/0284671 A1 | 11/2009 | Leister |
| 2009/0303248 A1 | 12/2009 | Ng |
| 2010/0073270 A1 | 3/2010 | Ishii et al. |
| 2010/0214646 A1 | 8/2010 | Sugimoto et al. |
| 2010/0253995 A1 | 10/2010 | Reichelt |
| 2010/0295836 A1 | 11/2010 | Matsumoto et al. |
| 2011/0109299 A1 | 5/2011 | Chaji et al. |
| 2011/0109670 A1 | 5/2011 | Sempel et al. |
| 2011/0199405 A1 | 8/2011 | Dallas et al. |
| 2011/0205100 A1 | 8/2011 | Bogaerts |
| 2011/0227887 A1 | 9/2011 | Dallas et al. |
| 2012/0086733 A1 | 4/2012 | Hudson et al. |
| 2012/0113167 A1 | 5/2012 | Margerm et al. |
| 2013/0038585 A1 | 2/2013 | Kasai |
| 2013/0308057 A1 | 11/2013 | Lu et al. |
| 2014/0085426 A1 | 3/2014 | Leone et al. |
| 2014/0092105 A1 | 4/2014 | Guttag et al. |
| 2015/0245038 A1 | 8/2015 | Clatanoff et al. |
| 2016/0103263 A1* | 4/2016 | Kazmierski ....... G02F 1/133609 |
| | | 362/559 |
| 2016/0203801 A1 | 7/2016 | De Groot et al. |
| 2016/0365055 A9 | 12/2016 | Hudson et al. |
| 2018/0061302 A1 | 3/2018 | Hu et al. |
| 2019/0096864 A1* | 3/2019 | Huitema ................. H01L 24/24 |
| 2019/0302917 A1 | 10/2019 | Pan |
| 2019/0333443 A1 | 10/2019 | He et al. |
| 2019/0347979 A1 | 11/2019 | Ahmed |
| 2019/0347994 A1 | 11/2019 | Lin et al. |
| 2019/0371229 A1 | 12/2019 | Wang et al. |
| 2020/0052702 A1* | 2/2020 | Hekmatshoartabari ....................... |
| | | H03K 19/018521 |
| 2020/0098307 A1 | 3/2020 | Li et al. |
| 2021/0201771 A1 | 7/2021 | Li et al. |
| 2023/0007751 A1* | 1/2023 | Bonne ....................... G09G 3/32 |
| 2023/0341986 A1* | 10/2023 | Chang ................... G06F 3/0412 |

FOREIGN PATENT DOCUMENTS

| | | |
|---|---|---|
| EP | 1187087 A1 | 3/2002 |
| GB | 2327798 A | 2/1999 |
| JP | 7049663 A | 2/1995 |
| JP | 2002116741 A | 4/2002 |
| JP | 2018185515 A | 11/2018 |
| JP | 2021515263 A | 6/2021 |
| KR | 20180009116 A | 1/2018 |
| TW | 227005 B | 7/1994 |
| TW | 407253 B | 10/2000 |
| TW | 418380 B | 1/2001 |
| TW | 482991 B | 4/2002 |
| TW | 483282 B | 4/2002 |
| TW | 200603192 A | 1/2006 |
| WO | 0070376 A1 | 11/2000 |
| WO | 0152229 A1 | 7/2001 |
| WO | 2007127849 A2 | 11/2007 |
| WO | 2007127852 A2 | 11/2007 |
| WO | 2019124952 A1 | 6/2019 |
| WO | 2019155243 A1 | 8/2019 |

OTHER PUBLICATIONS

Mansoorian, B, et al. "A 4-Side Tileable Back Illuminated 3D-integrated Mpixel CMOS Image Sensor." *Solid-State Circuits Conference-Digest of Technical Papers*, 2009. ISSCC 2009. IEEE International. 2009, pp. 38-39, 39a.

"2114A 1024 x4 Bit Static RAM", Component Data Catalog, Intel Corp., Santa Clara, CA, USA, 1982, 7 pages.

Amon, et al., "PTAT Sensors Based on SJFETs", 10th Mediterranean Electrotechnical Conference, MEleCon, vol. II, 2000, pp. 802-805.

Anderson, et al., "Holographic Data Storage: Science Fiction or Science Fact", Akonia Holographics LLC, presented at Optical Data Storage, 2014, 8 pages.

Armitage, et al., "Introduction to Microdisplays", John Wiley & Sons, 2006, pp. 182-185.

Authors Unknown, "Sony 3D", screen capture from video clip, 2009, 2 pages.

Baker, "CMOS Circuit Design, Layout, and Simulation", IEEE Press Series on Microelectronic Systems, John Wiley & Sons, Inc., Publication, 2010, pp. 614-616.

Campardo, et al., "VLSI—Design of Non-Volatile Memories", Springer, 2005, pp. 183-188.

Colgan, et al., "On-Chip Metallization Layers for Reflective Light Waves", Journal of Research Development, vol. 42, No. 3/4, May-Jul. 1998, pp. 339-345.

CSE370, "Flip-Flops", Lecture 14, https://studylib.net/doc/18055423/flip-flops, no date, pp. 1-17.

Dai, et al., "Characteristics of LCoS Phase-only spatial light modulator and its applications", Optics Communications vol. 238, especially section 3.2, 2004, pp. 269-276.

Drabik, "Optically Interconnected Parallel Processor Arrays", A Thesis, Georgia Institute of Technology, Dec. 1989, pp. 121-126.

Fuller, "Static Random Access Memory—SRAM", Rochester Institute of technology to Microelectronic Engineering, Nov. 18, 2016, pp. 1-39.

Hu, "Complementary MOS (CMOS) Technology", Feb. 13, 2009, pp. 198-200.

Jesacher, et al., "Broadband suppression of the zero diffraction order of an SLM using its extended phase modulation range", Optics Express, vol. 22, No. 14, Jul. 14, 2014, pp. 17590-17599.

Kang, et al., "Digital Driving of TN-LC for WUXGA LCOS Panel", Digest of Technical Papers, Society for Information Display, 2001, pp. 1264-1267.

Nakamura, et al., "Modified drive method for OCB LSD", Proceeding of the International Display Research Conference, Society for Information Display, Campbell, CA, US, 1997, 4 pages.

ONG, "Modern Mos Technology: Processes, Devices, and Design", McGraw-Hill Book Company, 1984, pp. 207-212.

Oton, et al., "Multipoint phase calibration for improved compensation of inherent wavefront distortion in parallel aligned liquid crystal on silicon display", Applied Optics, vol. 46, No. 23, Optical Society of America, 2007, pp. 5667-5679.

Pelgrom, et al., "Matching Properties of MOS Transistors", IEEE Journal of Solid-State Circuits, vol. 23, No. 5, Oct. 1989, 8 pages.

Potter, et al., "Optical correlation using a phase-only liquid crystal over silicon spatial light modulator", SPIE 1564 Opt. Info. Proc. Sys & Arch. III;, 1991, pp. 363-372.

Product Description, "Westar's Microdisplay Inspection System", www.westar.com/mdis, Jan. 2000, 2 pages.

Rabaey, et al., "Digital Integrated Circuits", A Design Perspective, Second Edition, Saurabh Printers Pvt. Ltd, 2016, pp. 138-140.

Rabaey, "The Devices Chapter 3", Jan. 18, 2002, pp. 121-124.

Robinson, et al., "Polarization Engineering for LCD Projection", John Wiley and Sons, Ltd., Chichester, England, 2005, pp. 121-123.

Sloof, et al., "An Improved WXGA LCOS Imager for Single Panel Systems", Proceedings of the Asia Symposium on Information Display, Society for Information Display, Campbell, CA, US, 2004, 4 pages.

SMPTE 274M-2005, "1920 x 1080 Image Sample Structure, Digital Representation and Digital Timing Reference Sequences for Multiple Picture Rates", SMPTE, White Plains, New York, US, 2005, 29 pages.

Underwood, et al., "Evaluation of an nMOS VLSI array for an adaptive liquid-crystal spatial light modulator", IEEE Proc, v.133 Pl.J. No., Feb. 1986, 15 pages.

Wang, "Studies of Liquid Crystal Response Time", University of Central Florida, Doctoral Dissertation, 2005, 128 pages.

Wu, "Discussion #9 MOSFETs", University of California at Berkeley College of Engineering Department of Electrical Engineering and Computer Sciences, Spring 2008, pp. 1-7.

Extended European Search Report for European Application No. 21783762.4, mailed Mar. 7, 2024, 8 pages.

* cited by examiner

DISPLAY BACKPLANE INCLUDING AN ARRAY OF TILES

RELATED APPLICATION

This application claims priority to U.S. Patent Application Ser. No. 63/005,731, filed Apr. 6, 2020, and incorporated herein in its entirety by reference.

BACKGROUND

Aspects of the present disclosure generally relate to different assemblies, and more specifically, to assemblies that include a backplane and to assemblies that include a backplane as well as arrays of other elements to form a display.

One overlooked aspect in many displays is the backplane technology used to drive the pixels of the main display panel (e.g., array of individual pixels and/or optical elements). The backplane is a design, assembly, or arrangement of various circuits and/or transistors that are responsible for turning the individual pixels on and off in the display panel, and therefore playing an important role in the overall display resolution, refresh rate, and power consumption.

A current challenge is to make backplanes that are highly integrated and that can be assembled or packaged with light emitting elements (e.g., light emitting diodes or LEDs) or light reflecting elements as well as optical elements. Packaging techniques for integrated optical and electronics elements continue to improve from those used in traditional packaging. For example, there are improved techniques for wafer level chip scale packaging (WLCSP) and for fan-out wafer-level packaging. Moreover, the dimensionality of the packaging has also improved to enable even denser solutions. Packaging has gone from one dimensional (1D) packaging where there is one chip per package, to 2D packaging (e.g., multiple chips per packaging), to 2.5D packaging with an interposer, and to 3D packaging with chip stacking. Even with all the improvements these techniques provide, they may not be able to meet the requirements for the types of assemblies needed in high resolution displays, including light field displays.

Accordingly, new techniques are desirable that enable the design and fabrication of assemblies having backplanes and assemblies having backplanes combined with arrays of other elements that form a display.

SUMMARY OF THE DISCLOSURE

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its purpose is to present some concepts of one or more aspects in a simplified form as a prelude to the more detailed description that is presented later.

In an aspect of the disclosure, a backplane for controlling light provided by a display is described. The backplane includes a plurality of tiles formed into an array, where each tile includes a plurality of complementary metal-oxide-semiconductor (CMOS) backplane dies, and where edges of the tiles forming an outer perimeter of the array include electrical connectors that direct electrical signals to at least one of the CMOS backplane dies.

In another aspect of the disclosure, a display assembly is described. The display assembly includes a backplane having an array of tiles, each tile having a plurality of electrically coupled CMOS backplane dies. Edges of the tiles forming an outer perimeter of the array include electrical connections directing electrical signals to one or more of the plurality of CMOS backplane dies. The display assembly further includes at least one light emitting diode (LED) array electrically coupled with at least one tile.

BRIEF DESCRIPTION OF THE DRAWINGS

The appended drawings illustrate only some implementation and are therefore not to be considered limiting of scope.

DETAILED DESCRIPTION

Figure 1:
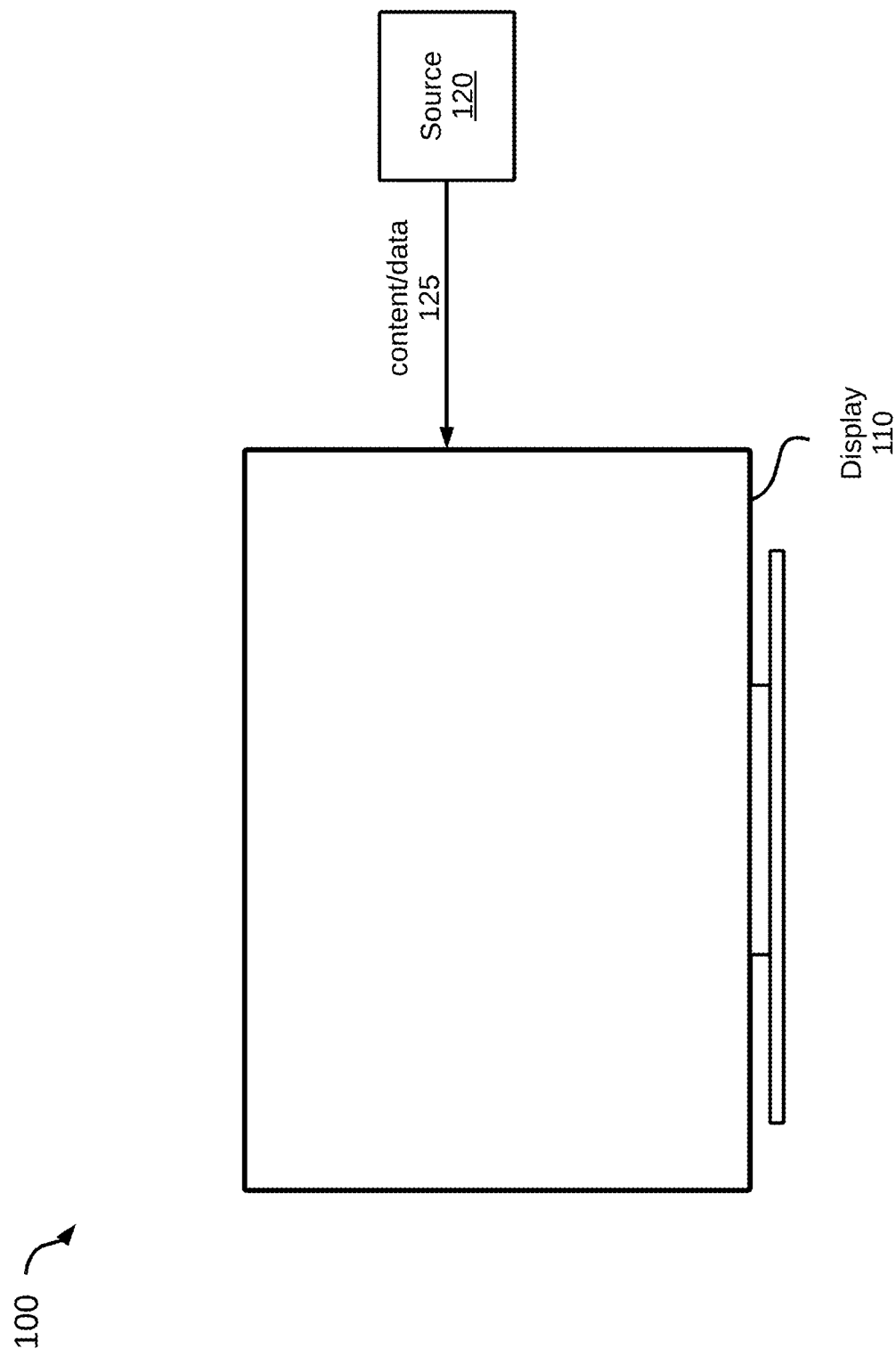
FIG. 1 illustrates an example of a display and a source of content for the display, in accordance with aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

The number of pixels in future displays is expected to be much greater than in current displays, sometimes orders of magnitude greater. Such displays will present challenges in the type of backplane assemblies or display assemblies that are ultimately used, particularly in terms of power consumption and overall bandwidth, as these factors may limit the ability to implement displays with very high resolution and extremely large pixel count. Aspects to consider in determining an appropriate backplane or display assembly include the different technology options as well as the different integration options. As used herein, the terms "backplane" and "backplane assembly" may be used interchangeably. Similarly, the terms "display" and "display assembly" may be used interchangeably. Moreover, in some implementations, a "display" or "display assembly" may include a "backplane" or "backplane assembly."

With respect to the technology options, various possible semiconductor technologies may be considered, including amorphous silicon (a-Si), metal oxides, low temperature polysilicon (LTPS), and complementary metal-oxide-semiconductor (CMOS) wafer, for example. Of these semiconductor technologies, LTPS and CMOS wafers may offer more flexible options for purposes of backplane bandwidth and density requirements. For example, CMOS wafers can support bandwidths in the range of 1 MHz-1,000 MHz and driver cell pitch in the range 1 μm-30 μm. On the other hand, LTPS can support bandwidths in the range of 1 MHz-15 MHz and driver cell pitch in the range 10 μm-10,000 μm.

An LTPS backplane design may involve a fabrication process flow that provides low cost and the fewest bonded interfaces. However, custom die placement tools capable of servicing large areas with high accuracy would be required. In some instances, LTPS may not be able to provide sufficient performance in terms of placement area and accuracy.

As described in this disclosure, a CMOS backplane design may be implemented using a panel level packaging (PLP) approach or alternatively, using wafer tiles as part of a wafer level packaging (WLP) approach. The PLP approach uses a single panel to form the backplane/display assembly while the WLP approach uses an array of wafer tiles to form the backplane/display assembly. Some of the benefits or advantages of these two approaches include using only known good CMOS die, and producing a high-performance backplane. Some of the challenges of the PLP approach are that panel level packaging processes are not generally available for production and custom or non-standard processes are needed. Custom processes may lead to increased production cost and time as well as possible decrease in quality. Some of the benefits or advantages of the WLP approach include good tool availability including LED bonding tools, laser lift-off tools, and microlens replication tools, and better yield with known-good tiles. The WLP approach may also provide a solution that evolves into the PLP approach. On the other hand, some of the challenges of the WLP approach are the need for precise tile dicing, the need for extremely precise tiling, the possible need for backside contacts if more than 4 wafer tiles are used in a display (e.g., for a 22 inch diagonal display with 12 inch square wafer tiles), and the possibility that a microlens tile seam may be visible (although in some embodiments, applying microlenses after completing the tiling process may reduce or eliminate the appearance of such seams).

Figure 2A:
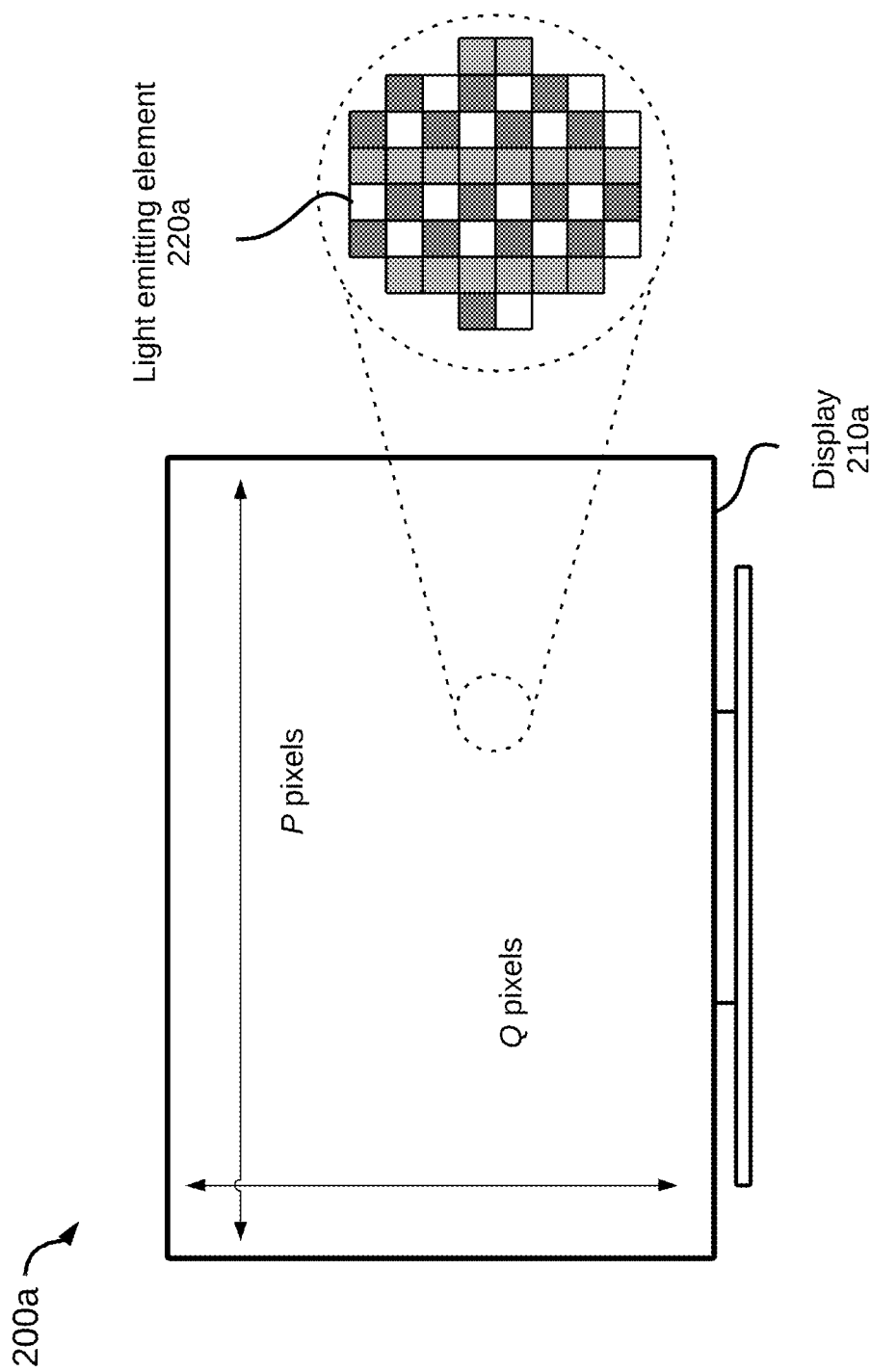
FIG. 2A illustrates an example of a display having multiple pixels, in accordance with aspects of this disclosure.
Figure 2B:
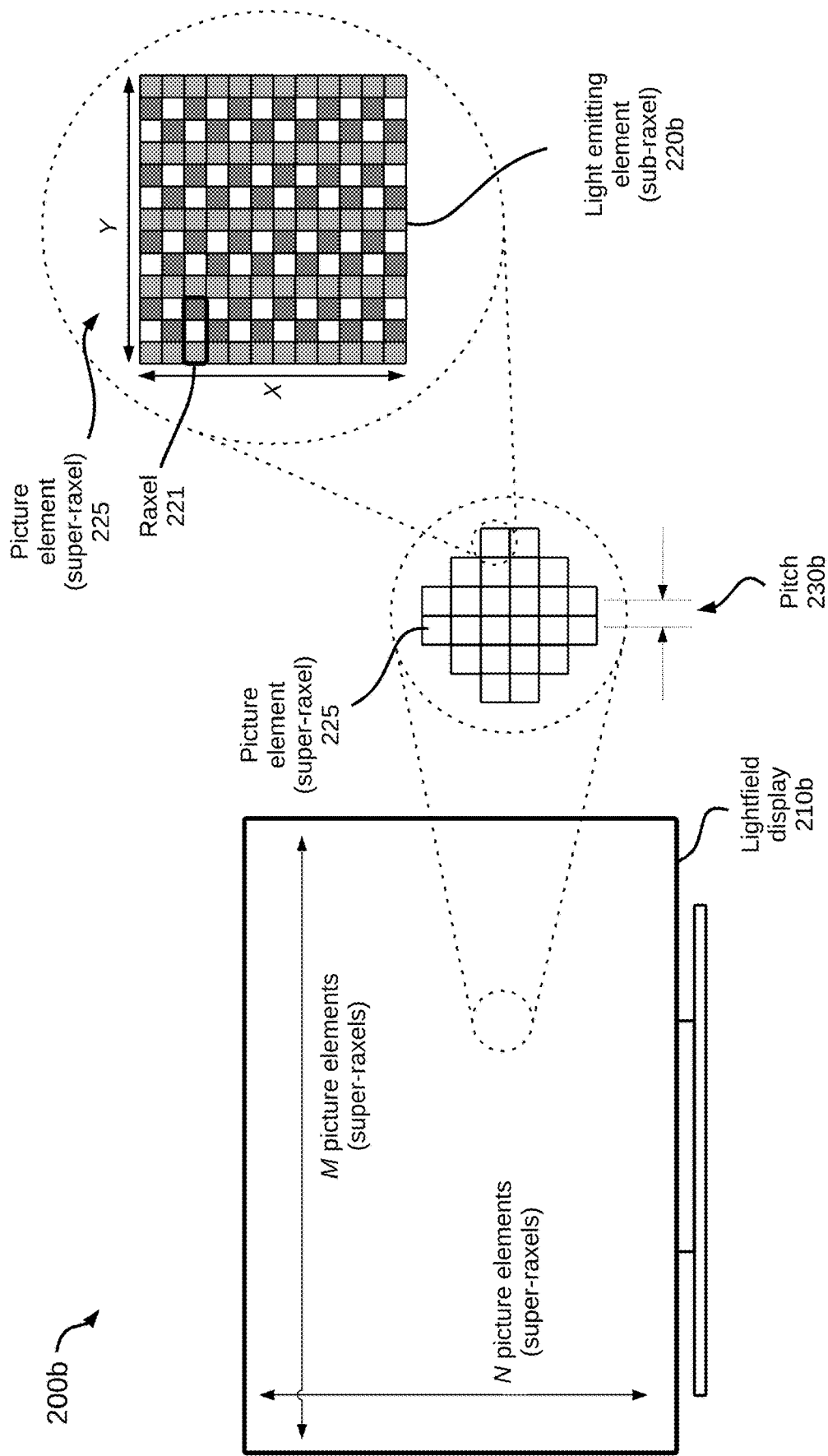
FIGS. 2B and 2C illustrate examples of a light field display having multiple picture elements, in accordance with aspects of this disclosure.
Figure 2C:
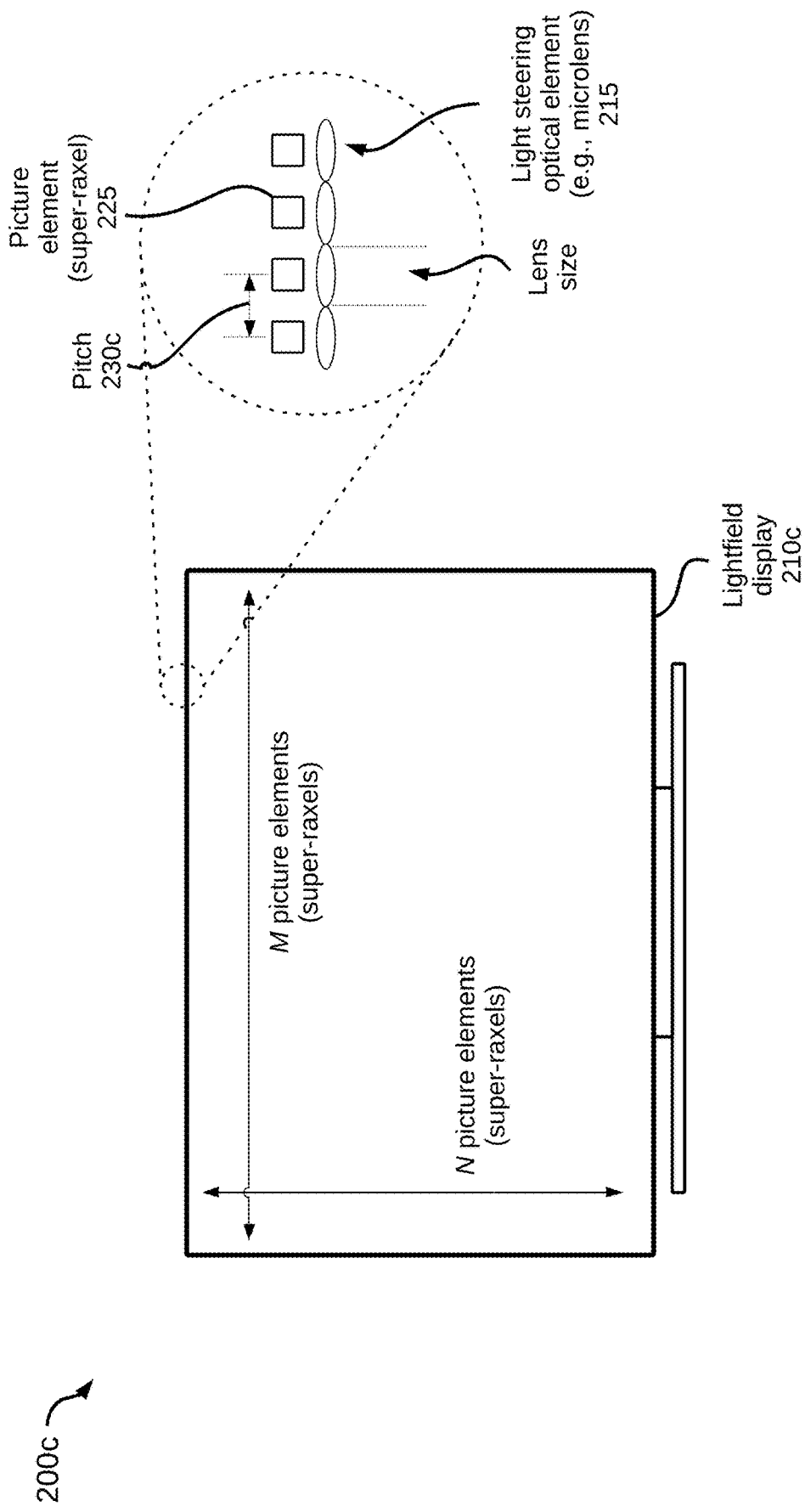

FIGS. 1-2C, which are described below, provide a general overview of the types of displays for which the various backplane and display aspects described in this disclosure may be applicable, including the PLP and WLP approaches for making backplanes or displays (e.g., backplanes with the addition of LEDs and microlenses).

FIG. 1 shows a diagram 100 that illustrates an example of a display 110 that receives content/data 125 (e.g., image content, video content, or both) from a source 120. The display 110 may include one or more panels (not shown), where each panel in the display 110 is a light emitting panel or a reflective panel containing light emitting elements (as shown in FIG. 2A, for example) or light reflecting elements, respectively. Each panel may also include a backplane or a backplane assembly for driving the light emitting or light reflecting elements. Each panel may be made of a single CMOS panel (e.g., using a CMOS backplane panel) or may be made of multiple CMOS wafer tiles (e.g., using CMOS backplane wafer tiles). When light emitting panels are used they may include multiple light emitting elements, which may be referred to herein as a "sub-raxel" (see e.g., sub-ravel or light emitting elements 220a in FIG. 2A), arranged in an array. A plurality of sub-ravels may be arranged in a grid or array to form a "raxel" 221 (see FIG. 2B). These light emitting elements may be light-emitting diodes (LEDs) made from one or more semiconductor materials and the LEDs may be monolithically integrated on a single substrate. The LEDs may be inorganic LEDs. The LEDs may be micro-LEDs, also referred to as microLEDs, mLEDs, or uLEDs. Other display technologies from which the light emitting elements may be made include liquid crystal display (LCD) technology or organic LED (OLED) technology. The terms "light emitting element," "light emitter," or simply "emitter," may be used interchangeably in this disclosure.

The display 110 may have capabilities that include ultra-high-resolution capabilities (e.g., support for resolutions of 8K and higher), high dynamic range (contrast) capabilities, or light field capabilities, or a combination of these capabilities. The display 110 may further include light field capabilities and may operate as a light field display as illustrated in FIGS. 2B, 2C. To enable such light field capabilities, display 110 may include multiple picture elements, also referred to herein as "super-raxels," where each super-raxel (e.g., super-raxel 225 in FIGS. 2B and 2C) includes a plurality of groups (e.g., raxels 221 in FIG. 2B) of sub-raxels. The plurality of light emitting elements within each ravel may be monolithically integrated on a same semiconductor substrate. Each raxel within the super-raxel may be independently activated to emit light from a particular location (e.g., from a particular (x, y) coordinate location) relative to the light steering optical element. By selectively emitting or reflecting light from different locations, multiple views may be supported by the light field display, as will be discussed herein below with respect to FIGS. 2A-2C.

A diagram 200a in FIG. 2A shows a display 210a having multiple light emitting elements 220a (also referred to as pixels or display pixels). The light emitting elements 220a, which may be LEDs as discussed above, are generally formed in an array and are adjacent to each other to provide for a higher pixel density, and thus, higher resolution of the display 210a. The display 210a may be an example of the display 110 in diagram 100 of FIG. 1.

In the example shown in FIG. 2A, the light emitting elements 220a may be organized or positioned into a Q×P array over the area of the display 210a, with Q being the number of rows of pixels in the array and P being the number of columns of pixels in the array. An enlarged portion of such an array is shown to the right of the display 210a. Though not shown, the display 210a may include, in addition to the array of light emitting elements 220a, a backplane that includes various electrical traces and contacts configured to selectively deliver power to one or more of the light emitting elements 220a. The backplane coupled with the display 210a may be based on the features or configurations described herein.

A diagram 200b in FIG. 2B shows a light field display 210b having multiple picture elements or super-raxels 225. In this disclosure, the term "picture element" and the term "super-raxel" may be used interchangeably to describe a similar structural unit in a light field display. The light field display 210b may be an example of the display 110 in the diagram 100 having light field capabilities. The light field display 210b may be used for different types of applications and its size may vary accordingly. For example, light field display 210b may have different sizes when used as displays for watches, near-eye applications, phones, tablets, laptops, monitors, televisions, and billboards, to name a few. Accordingly, and depending on the application, the picture elements 225 in the light field display 210b may be organized into arrays, grids, or other types of ordered arrangements of different sizes. The picture elements 225 of the light field display 210b may be distributed over one or more display panels.

In the example shown in FIG. 2B, the picture elements 225 are organized or positioned into an N×M array, with N being the number of rows of picture elements in the array and M being the number of columns of picture elements in the array. An enlarged portion of such an array is shown to the right of the light field display 210b. When the picture elements or super-ravels 225 include, as light emitting elements 220b, different LEDs on a same semiconductor substrate that produce red (R) light, green (G) light, and blue (B) light, the light field display 210b may be said to be made from RGB LED super-raxels. These LEDs of different colors may be monolithically integrated on a same substrate and may range in size from approximately 1 micron to approximately 100 microns.

Each of the picture elements 225 in the light field display 210b may include a corresponding light steering optical element (e.g., an integral imaging lens 215 illustrated in a diagram 200c in FIG. 2C). The picture elements 225 represent a minimum picture element size that defines the display resolution. In this regard, a raxel 221 (e.g., an array or grid of light emitting elements 220b) of picture element 225 may be smaller than the corresponding light steering optical element 215 for that picture element. In practice, however, it is possible for the size of the raxel of a picture element 225 to be similar to the size of the corresponding light steering optical element 215 (e.g., the diameter of a microlens or lenslet), which in turn may be similar or the same as a pitch 230b between picture elements 225. In some embodiments, the super-raxel may be smaller than or approximately the same size as the picture element. Larger super-raxels (e.g., super-ravels having a size approximately the same as the picture element) may provide increased ray angle resolution As mentioned above, an array of light emitting elements 220b may be arranged into "raxels" 221 as shown within an enlarged version of the picture element 225 shown to the right of the diagram 200b. The picture element 225 may be an array X×Y of light emitting elements 220b, with X being the number of rows of light emitting elements 220b in the array and Y being the number of columns of light emitting elements 220b in the array. In one example, the picture element 225 is a 9×9 array including 81 light emitting elements or sub-raxels 220b.

In FIG. 2C, a diagram 200c shows another example of a light field display 210c and an enlarged view of a portion of an array of picture elements 225 having corresponding light steering optical elements 215 as described above. A pitch 230c may represent a spacing or distance between the centers of adjacent picture elements 225 and may be about a size of the light steering optical element 215 (e.g., size of a microlens or lenslet) such that the light steering optical elements have no gap or minimal gap therebetween when arranged into an array to form light field display 210c. Although the picture elements 225 are shown as separated from each other in FIG. 2C, this is just for illustration purposes and they may be built adjacent to each other without space therebetween.

Figure 3A:
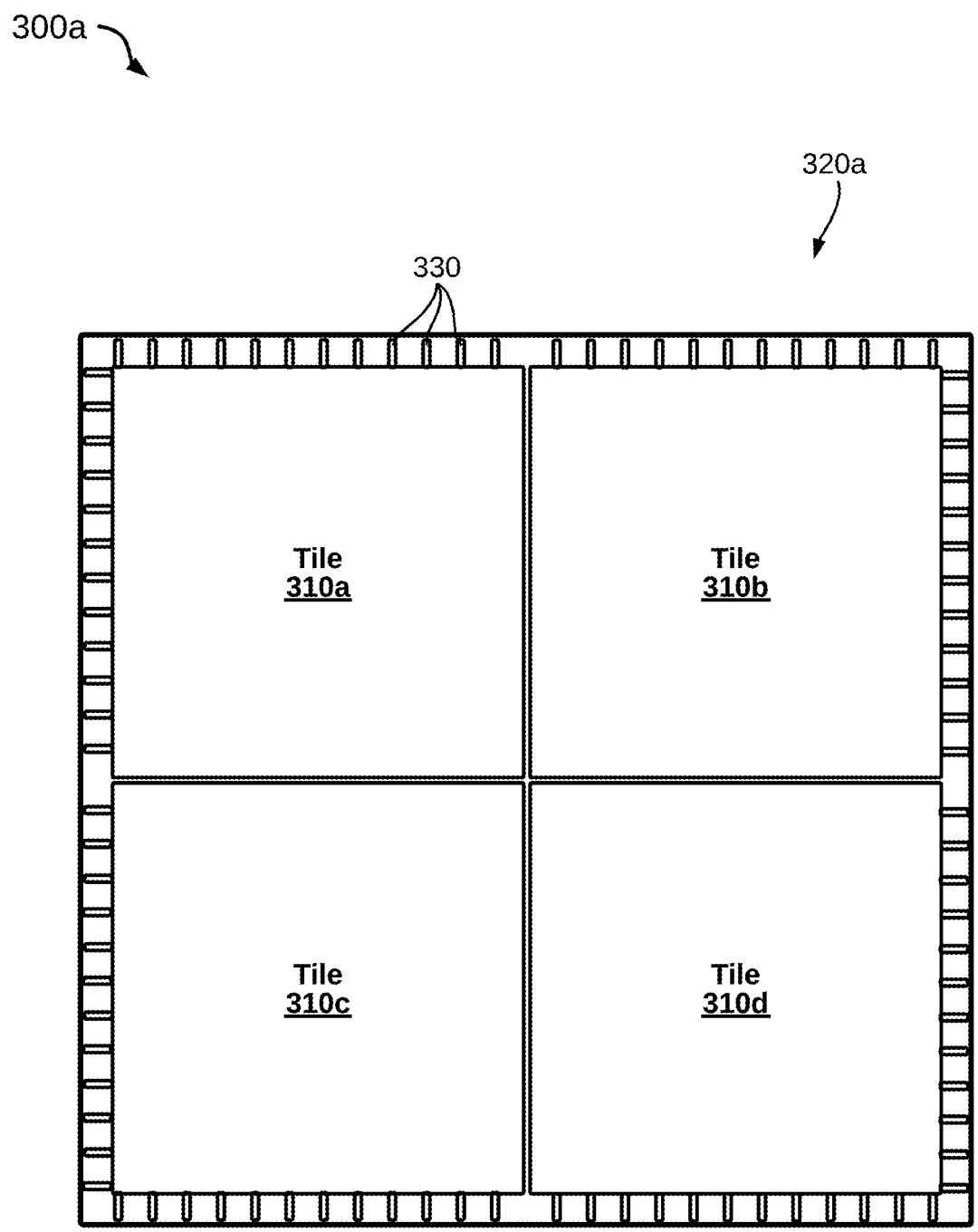
FIG. 3A illustrates an example of a backplane formed with multiple tiles, in accordance with aspects of this disclosure.

FIG. 3A illustrates a diagram 300a with an example of a backplane 320a formed with multiple tiles 310a, 310b, 310c, 310d, in accordance with aspects of this disclosure. The backplane 320a may be used with any of the displays described above in connection with FIGS. 1-2C. The backplane 320a, which may also be referred to as a backplane assembly, may be made with four (4) tiles (e.g., tiles 310a, 310b, 310c, and 310d) arranged to form an array.

Although the example of FIG. 3A has four tiles, the backplane may be made with more or fewer tiles without departing from the scope hereof. Electrical connectors 330 may be used to communicate signals to and/or from one or more of the tiles 310a-310d. When one or more of the tiles 310a-310d on the backplane 320a includes light emitting elements and/or optical elements or components (e.g., sub-ravels, ravels, and/or super-ravels), the backplane 320a may also be referred to as a display or display assembly, for example.

As described in more detail below with respect to FIG. 4, each of the tiles or wafer tiles 310a-310d may be diced or cut from a reconstructed wafer that includes multiple CMOS backplane dies (where each of those die is known to be a good, working die). That is, each tile includes multiple, separate, and electrically interconnected CMOS backplane dies (not shown) held together in the tile. As shown in the diagram 300a, edges of the tiles 310 at an outer perimeter of the backplane 320a provide the electrical connectors 330 to allow interaction and/or communication with the CMOS backplane dies in each of the tiles 310a-310d. Through-silicon via (TSV) electrical connections may be used to provide electrical connection between a substrate of the backplane 320a and one or more tiles 310a-310d instead of or in addition to the electrical connectors 330 disposed around edges of the tiles. Each CMOS backplane die in a tile is a CMOS integrated circuit configured to provide electrical signals to control a respective subset of light emitting elements or light reflecting elements electrically coupled therewith.

Figure 3B:
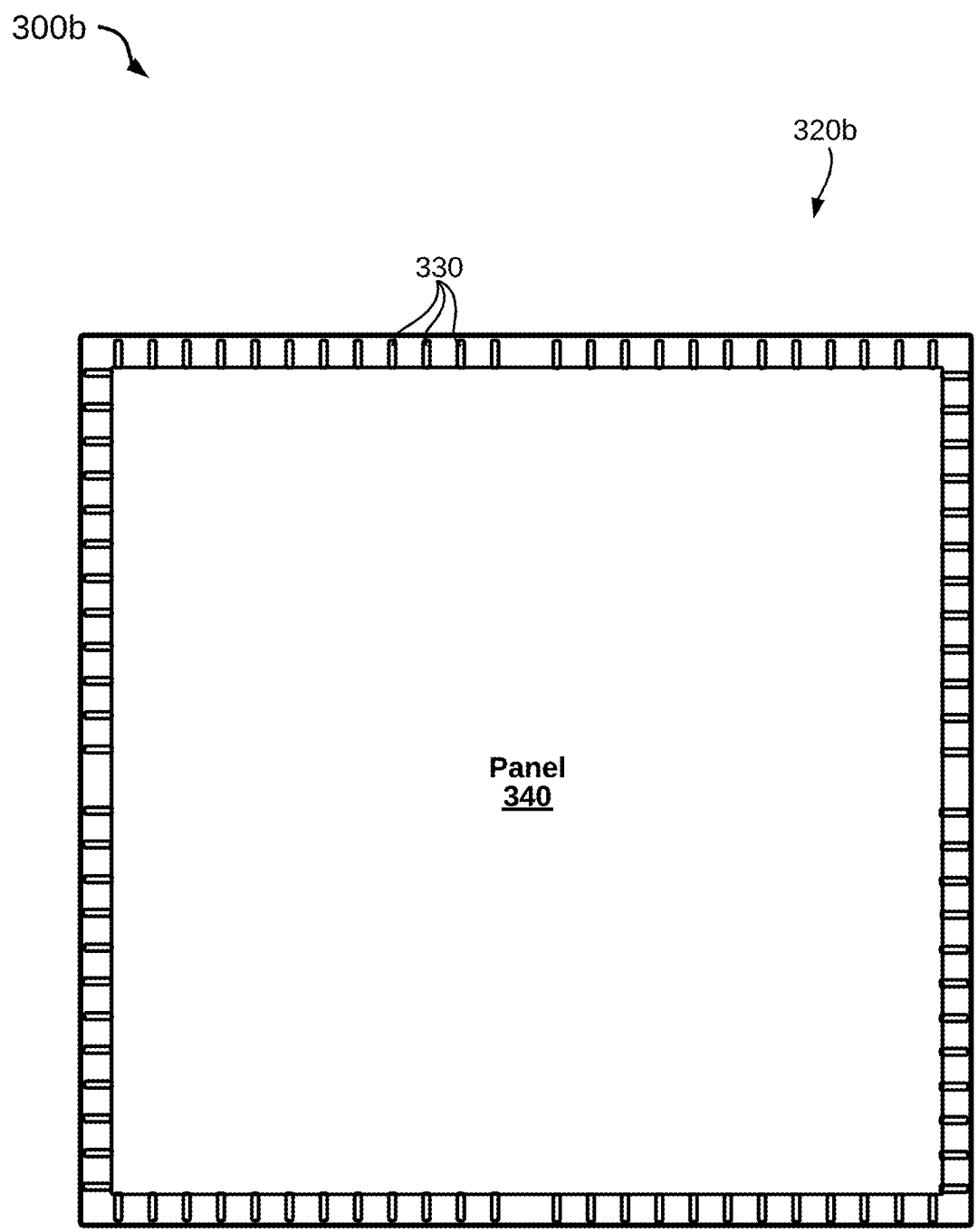
FIG. 3B illustrates an example of a backplane formed with a single panel, in accordance with aspects of this disclosure.

FIG. 3B illustrates a diagram 300b an example of a backplane 320b formed with a single panel 340, in accordance with aspects of this disclosure. The backplane 320b may be used with any of the displays described above in connection with FIGS. 1-2C. The backplane 320b may also be referred to as a backplane assembly. Electrical connectors 330 may be used to communicate signals to and/or from the panel 340. When the backplane 320b is coupled with light emitting elements and/or optical elements or components, the assembly may be referred to as a display or display assembly. Examples of electrical connections between the electrical connectors 330 and light emitting elements in the display assembly are discussed in further detail with respect to FIGS. 5A-5K below.

As described in more detail below, the panel 340 includes multiple, separate, and electrically interconnected CMOS backplane dies (not shown) held together in the panel. The panel 340 may be formed using the same methods as those used to form the reconstructed wafers, but on a larger scale. As shown in the diagram 300b, edges of the panel 340 in an outer perimeter provide the electrical connectors 330 to interact or communicate with one or more of the CMOS backplane dies in the panel. Each CMOS backplane die in the panel is a CMOS integrated circuit configured to provide signals to control one or more respective subsets of light emitting elements (e.g., one or more sub-raxel 220b, FIG. 2B) or light reflecting elements of the display.

Figure 4:
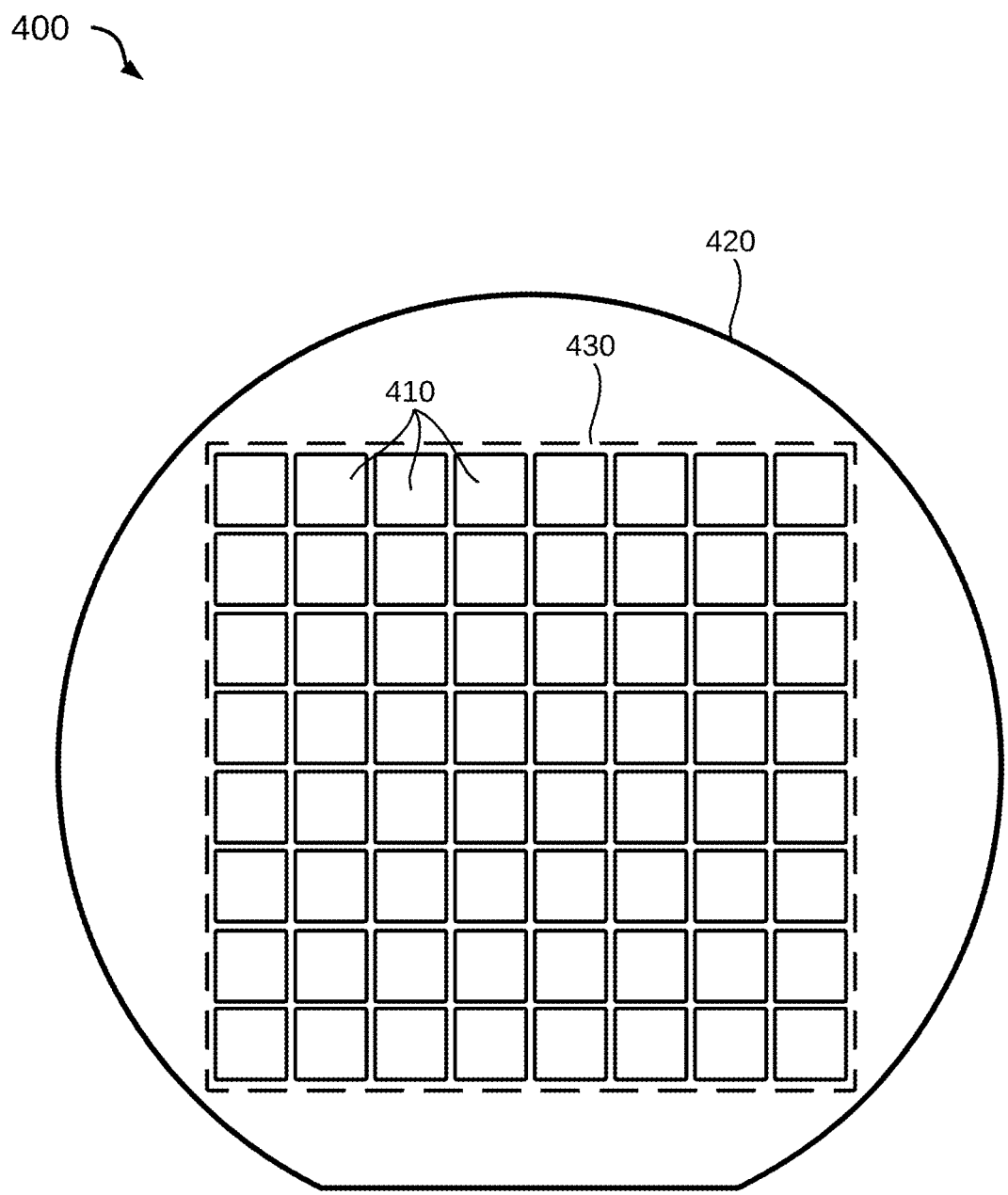
FIG. 4 illustrates an example of a reconstructed wafer from which tiles are diced, in accordance with aspects of this disclosure.

FIG. 4 illustrates a diagram 400 that shows an example of a reconstructed wafer 420 from which a tile 430 is diced or cut, in accordance with aspects of this disclosure. Tile 430 may represent tiles 310 of FIG. 3A. In order to use conventional semiconductor manufacturing and processing equipment, which generally requires wafers to have a specific size and shape, one method to form or fabricate tiles or wafer tiles (e.g., tiles 310a-310d in FIG. 3A) is to reconstruct a wafer of a standard size and shape by placing multiple CMOS backplane dies 410 into an array on the wafer 420, and then cutting or dicing a square or rectangular tile 430 (dashed lines) from the reconstructed wafer 420 after the wafer 420 is processed using conventional manufacturing steps. This allows for the reconstructed wafer 420 (and thus the tile 430) to be processed through various conventional semiconductor manufacturing steps configured to handle the standard size/shape wafer, since, without wafer 420, the square or rectangular tiles 430 are non-standard in size and shape and unsuitable for conventional semiconductor processing tools and equipment.

FIGS. 5A-5I illustrate diagrams 500a-500i that show an example steps for forming a backplane assembly (e.g., one or more of backplanes 320a and 320b of FIGS. 3A and 3B) and a display assembly (e.g., display 110, 210a, 210b, and 210c of FIGS. 1, 2A, 2B, and 2C, respectively) using a wafer level packaging (WLP) approach, in accordance with aspects of this disclosure.

Figure 5A:
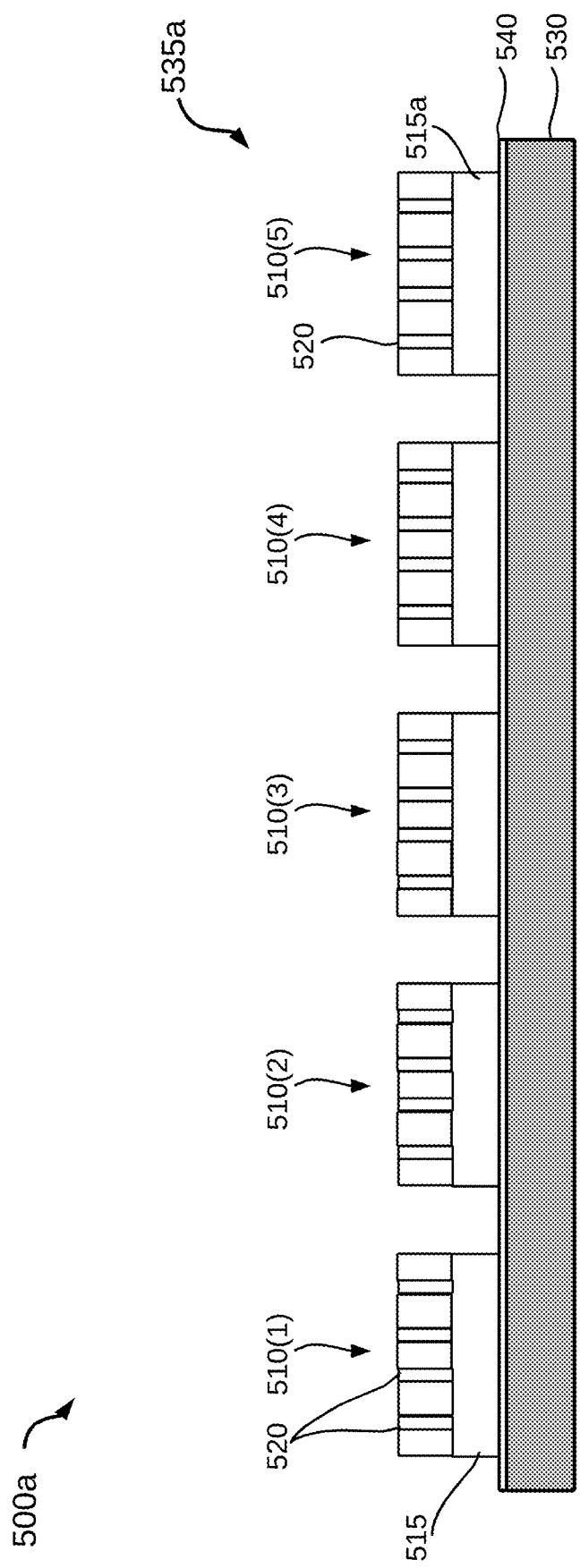
FIGS. 5A-5K illustrate an example of forming a backplane and a display using wafer level packaging (WLP), in accordance with aspects of this disclosure.

The diagram 500a in FIG. 5A shows a cross-sectional view of at least part of a tile 535a diced from a reconstructed wafer (e.g., the reconstructed wafer 420 in FIG. 4). The tile 535a includes a substrate 530 with an adhesive layer 540 to which multiple CMOS backplane dies 510 (e.g., the CMOS backplane dies 410 in FIG. 4) are attached. The adhesive layer 540 may provide a permanent bond of the CMOS backplane dies 510 to the substrate 530, which may mitigate die shift. In this example, each CMOS backplane die 510 is positioned die side up with pillars 520 (e.g., die or chip electrical connections) facing away from the substrate 530 and configured to electrically couple with additional display components (not shown). A base 515a of the die (e.g., a portion of the CMOS backplane dies 510 including backplane electronics and circuitry) located below the pillars 520 is adjacent the adhesive layer 540 and substrate 530. The pillars 520 may be copper (Cu) pillars, that is, Cu may be used for die electrical connectivity: however, other conductive metals or materials may also be used. The CMOS backplane dies 510 are shown separated (e.g., with gaps between adjacent CMOS backplane dies) for purposes of illustration but are intended to be closely packed and therefore may be closely positioned to adjacent dies. In an example, a 100 μm gap between CMOS backplane dies 510 may be desirable, although 300 μm may be currently possible with existing semiconductor assembly and test (OSAT) tools.

Figure 5B:
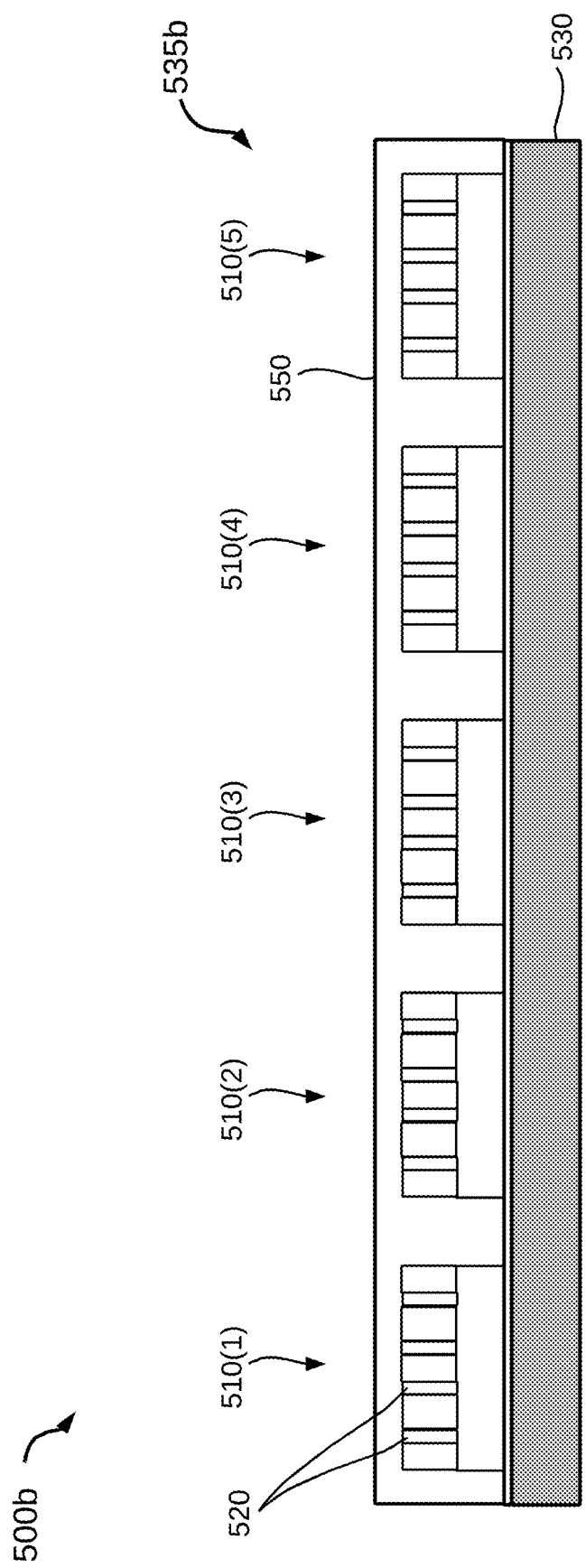

The diagram 500b in FIG. 5B shows the deposition of an overmold 550 (or similar encapsulating material) over and around the CMOS backplane dies 510 on the tile 535b to hold the CMOS backplane dies 510 together. In this example, there is an amount of the overmold 550 that covers a top portion of the CMOS backplane dies 510 (e.g., an excess amount). The overmold 550 may be a custom material suitable for the application. One example is silica-loaded epoxy molding compound (EMC), which is rigid when cured but may cause die shifting. Another example is a polyimide, which may be compliant but there may not be a current method or process for dispensing it. In some instances, inkjet techniques may be used to dispense polyimide.

Figure 5C:
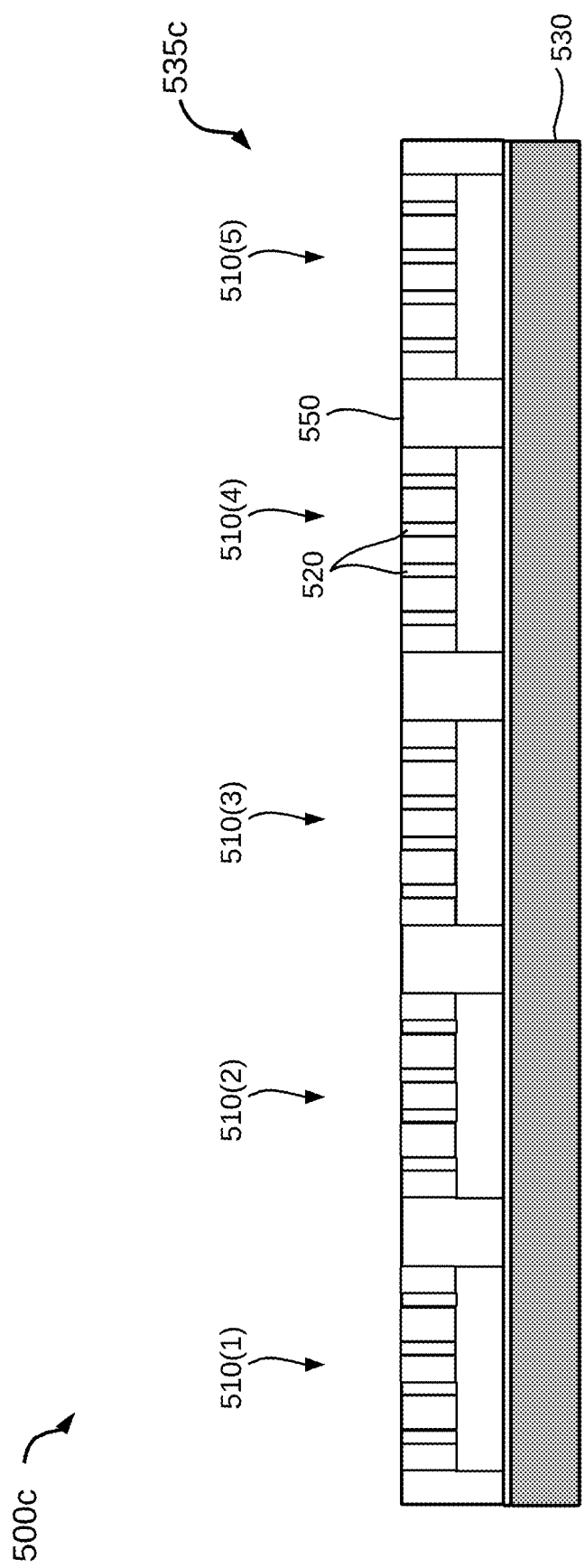

The diagram 500c in FIG. 5C shows a tile 535c illustrating the result of grinding, etching, or otherwise removing a portion of the overmold 550 such that the top portions of the CMOS backplane dies 510 (e.g., the tops of pillars 520) are exposed (e.g., the excess amount of overmold is removed). When polyimide is used for the overmold 550, it is important to note that polyimide may not always grind well and a different approach may be used to dispense the polyimide, such as deposition with a squeegee or direct patterning without grinding.

Figure 5D:
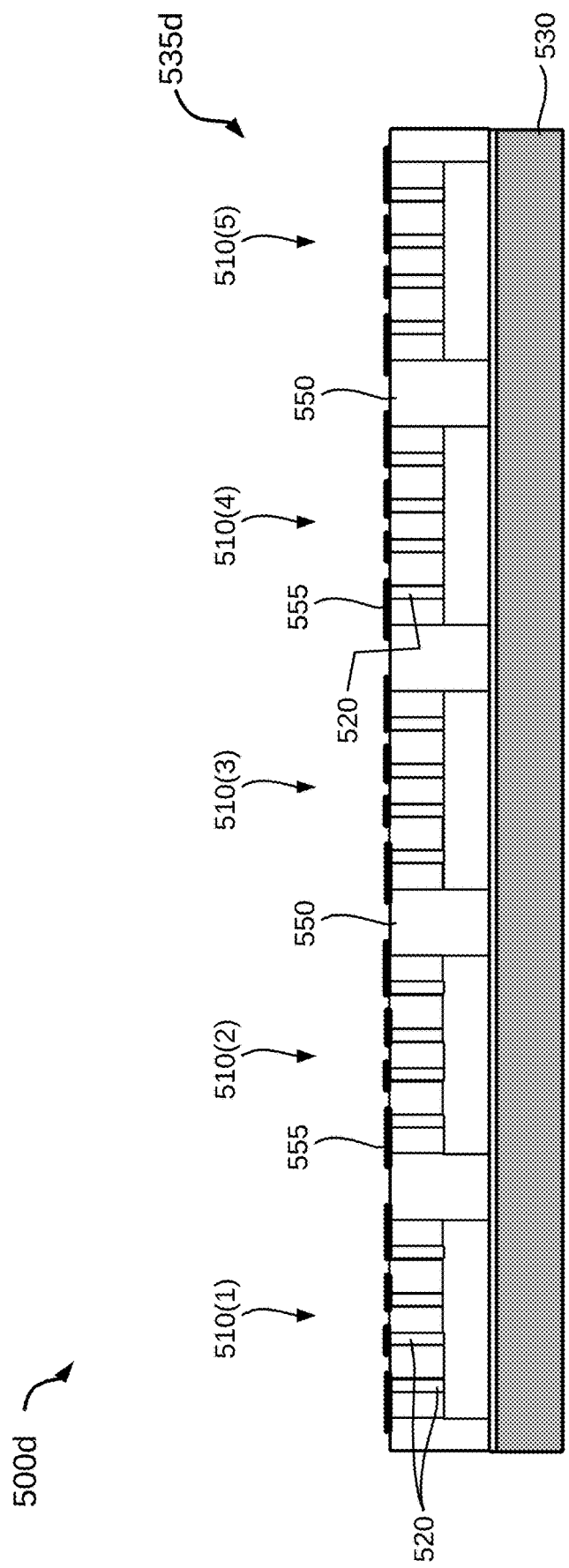

The diagram 500d in FIG. 5D shows a tile 535d after the deposition of an electrical redistribution layer (RDL) 555, such as a copper (Cu) RDL, over the exposed portions of the pillars 520 (as shown in FIG. 5C) of CMOS backplane dies 510 to form interconnects between the CMOS backplane dies 510. In particular, the RDL 555 provides electrical connections between pillars 520 of different CMOS backplane dies 510 to interconnect the CMOS backplane dies 510. A standard process may be used for depositing the RDL 555. In one example, adaptive lithography may be used to account for die shift, although the wiring density needed in the RDL may be challenging for adaptive lithography techniques.

Figure 5E:
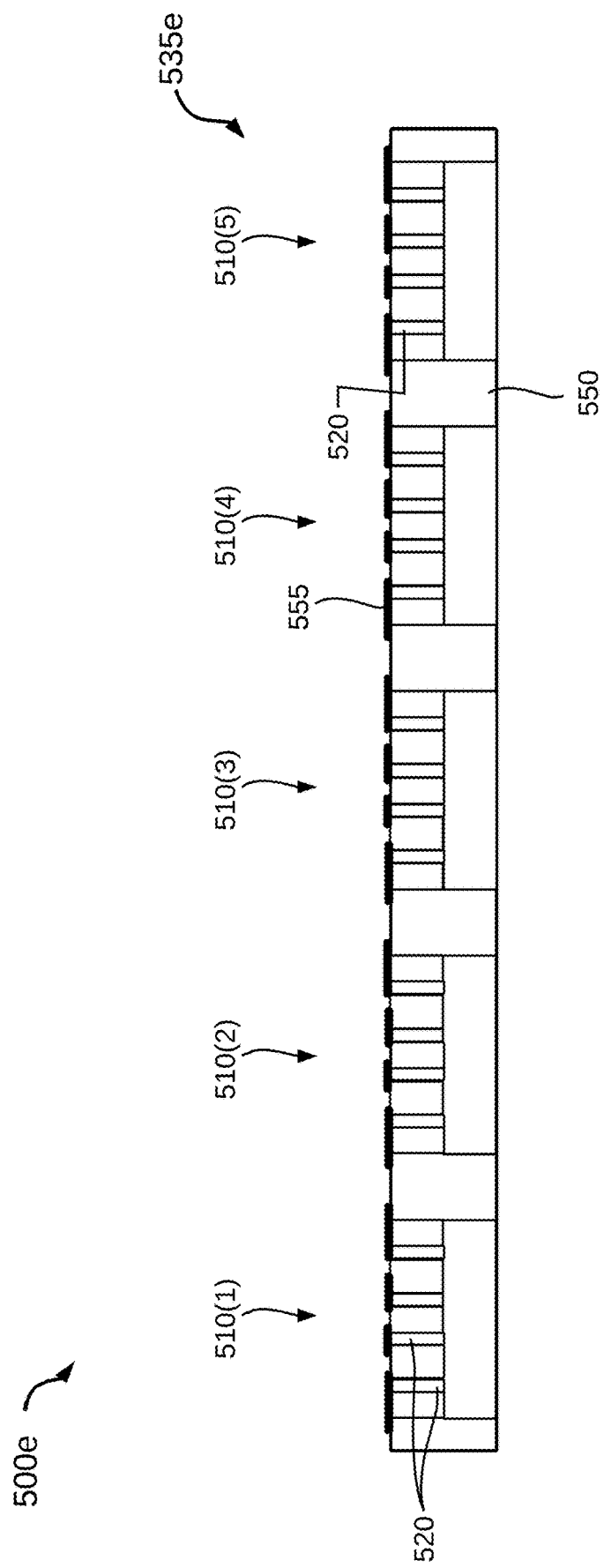

The diagram 500e in FIG. 5E shows a partial cross-sectional view of tile 535e diced from a reconstructed wafer where the substrate 530 and adhesive layer 540 have been removed. Alternatively, the tile 535e may have been formed without the use of the substrate 530 and/or adhesive layer 540, whereby the CMOS backplane dies 510 are held together by the overmold 550. As shown in the diagram 500e, the RDL 555 is at the top of the tile 535e (i.e., on top of exposed pillars 520 of one or more CMOS backplane die 510) and the bottom of the CMOS backplane dies 510, form a bottom of the tile 535e.

Without any additional components (e.g., LED arrays and/or microlens arrays), the tile 535e shown in the diagram 500e, or the reconstructed wafer from which tile 535e was diced, may be considered a backplane or backplane assembly. However, additional components or elements (e.g., LED arrays and/or microlens arrays) may be added to the backplane or backplane assembly on the reconstructed wafer (as described in more detail below), and the structure may be considered a display assembly that may be diced or cut in the manner described above in connection with FIG. 4.

Figure 5F:
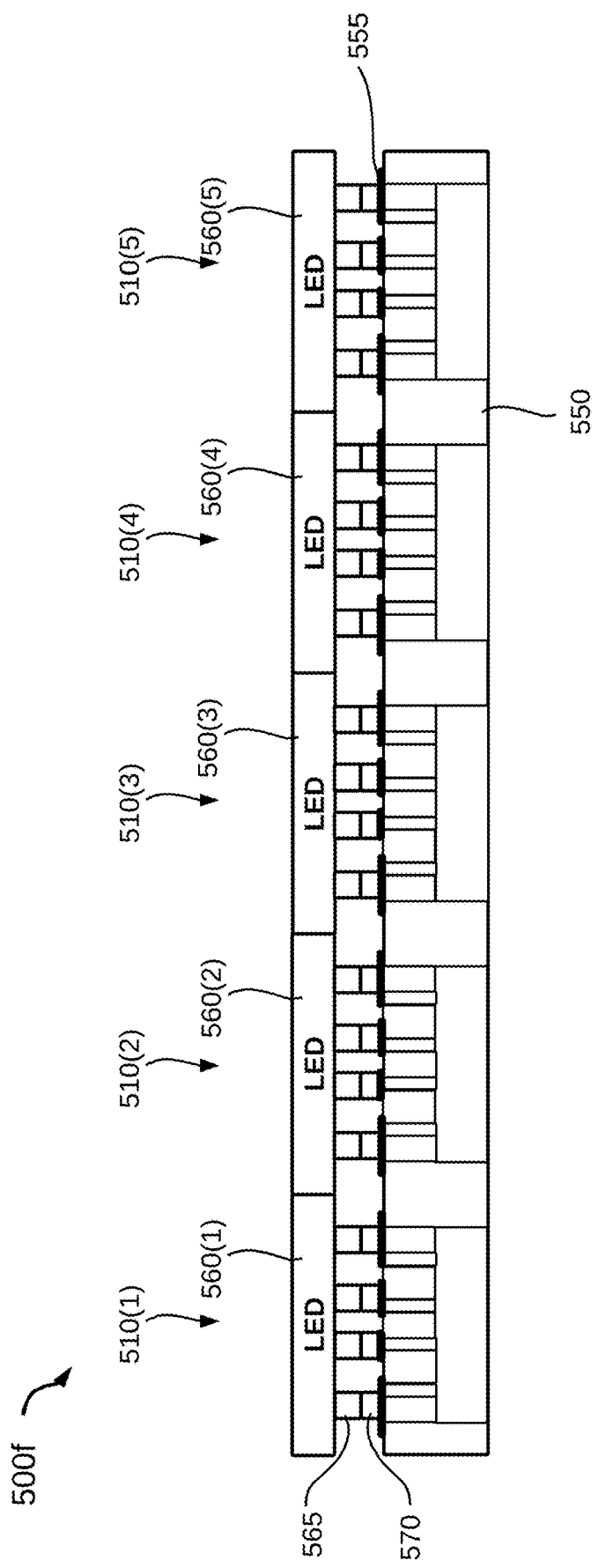

The diagram 500f in FIG. 5F shows the result of flip chip bonding LED arrays 560 to the CMOS backplane dies 510. Each of the LED arrays 560 is, for example, a separate semiconductor chip or die that includes multiple light emitting elements such as the ones described above in connection with FIGS. 2A-2C. The LED arrays 560 may include electrical contacts or connections 565 that electrically connect with portions of the RDL 555 or other electrical connections 570 placed over the RDL 555. Although the diagram 500f shows a one-to-one correspondence between an LED array 560 and a CMOS backplane die 510, this is just by way of illustration and not of limitation. It is also possible that a single LED array 560 may be electrically coupled with multiple CMOS backplane dies 510, or alternatively, that multiple LED arrays 560 may be electrically coupled with a single CMOS backplane die 510. The electronics and circuitry of the CMOS backplane dies 510 may be selected to control the operation of one or more of the light emitting elements within one or more of the corresponding LED arrays 560. Additional electrical connection schemes to connect LEDs, CMOS backplane dies, and/or other components within the display assembly using an RDL are discussed with respect to FIGS. 5J and 5K below.

In another implementation, arrays of light reflecting elements, such as digital micromirror device (DMD) reflectors, may be used in combination with or instead of the LED arrays 560, in which case the electronics and circuitry of the CMOS backplane dies 510 may be selected to control the operation of one or more of the light reflecting elements. A display assembly having a plurality of DMD reflector arrays 590 is shown in FIG. 5I. Similar to the assembly shown in FIG. 5F, one or more of electrical contacts or connections 565, 570 may electrically couple the RDL 555 to the DMD arrays 590. One or more DMD array 590 may be electrically coupled with each of the CMOS backplane dies 510: alternatively, one or more of the CMOS backplane dies 510 may be electrically coupled with each of the DMD arrays 590.

Further in connection with the diagrams 500f and 500i, some consideration is to be given to the accuracy of the flip chip bonding, as well as to the use of laser lift-off (LLO) such as available wafer scale LLO tools to, for example, remove the reconstructed wafer from the substrate 530 and/or separate the LED arrays 560 or DMD arrays 590 that are to be flip chip bonded. Additional considerations include the use of an underfill to compensate for a mismatch in the coefficient of thermal expansion (CTE) between the LED arrays (or DMD reflector arrays 590) and the CMOS backplane dies, difficulties in feeding the underfill when gaps between the flip chip connections are small, and whether to use underfill instead a pre-applied film. If no underfill is used, then consideration may be given to whether voids may occur in connection with microlenses and how to avoid such occurrences.

Figure 5G:
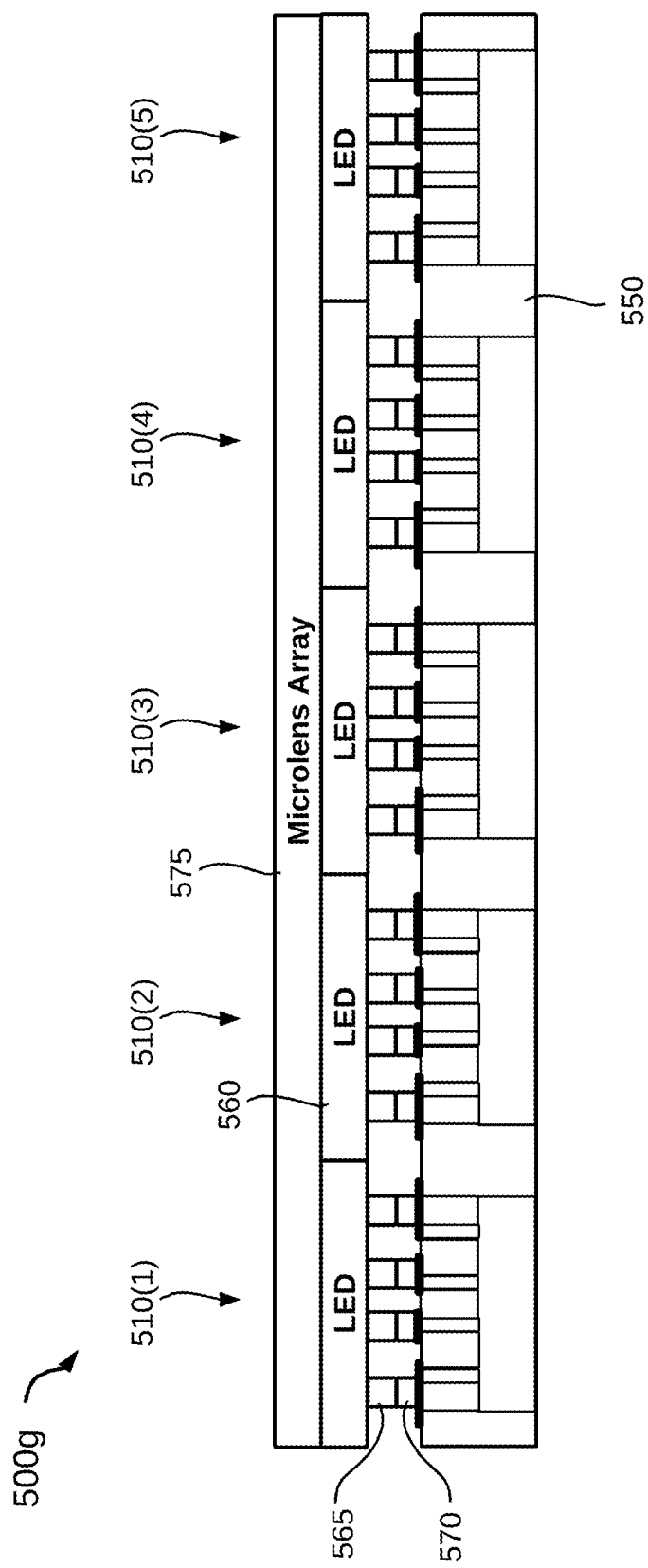

The diagram 500g in FIG. 5G shows a microlens array 575 disposed over and attached to LED arrays 560 that have been flip chip bonded onto the RDL 555 on top of CMOS backplane dies 510. The microlens array 575 may include various optical elements, such as the light steering optical elements 215 (e.g., lenses or microlenses) described above in connection with FIG. 2C. Although the diagram 500g shows a single microlens array 575, this is just by way of illustration and not of limitation. It is also possible to use multiple microlens arrays 575. Moreover, there need not be a one-to-one correspondence between the CMOS backplane dies 510, the LED arrays 560, and the microlens arrays 575, as shown in more detail below.

Figure 5H:
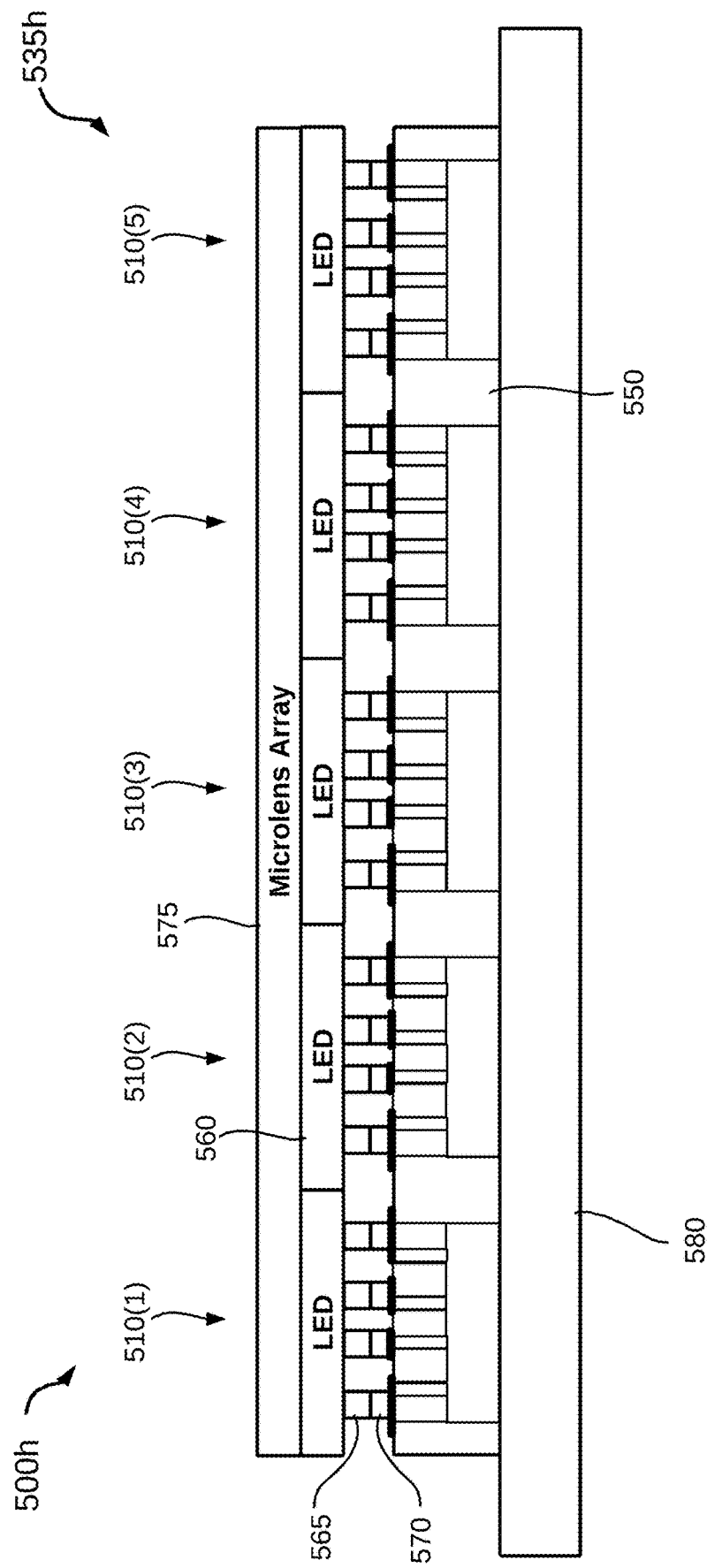
Figure 5I:
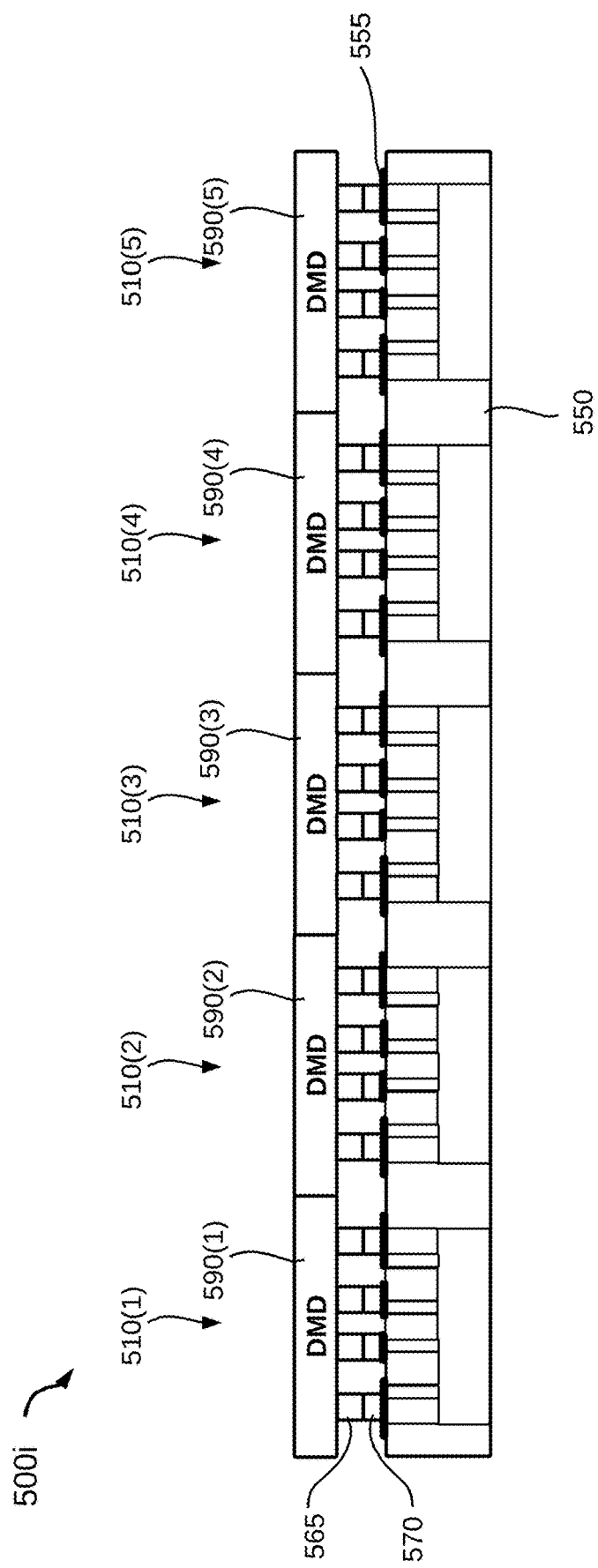

The diagram 550h in FIG. 5H shows the result of tile dicing and tile bonding as described above in connection with FIGS. 3A and 4. In this example, at least a portion of the reconstructed wafer shown in FIG. 5G is cut by high precision dicing to form a diced tile 535h. The cross-sectional view of the diced tile in this example includes the CMOS backplane dies 510, with flip chip bonded LED arrays 560 connected to the CMOS backplane dies 510 through electrical connections 565, 570 and RDL 555, and one or more microlens arrays 575 over the LED arrays 560. The diced tile 535h may be bonded (e.g., by permanent bond using, for example, an adhesive layer (not shown)), along with other tiles (see e.g., FIG. 3A) to a rigid substrate 580. The tile bonding may require a high degree of alignment accuracy over a large area. The plurality of tiles may be assembled on a backplane to form a display assembly, as described with respect to FIG. 3A above.

Figure 5J:
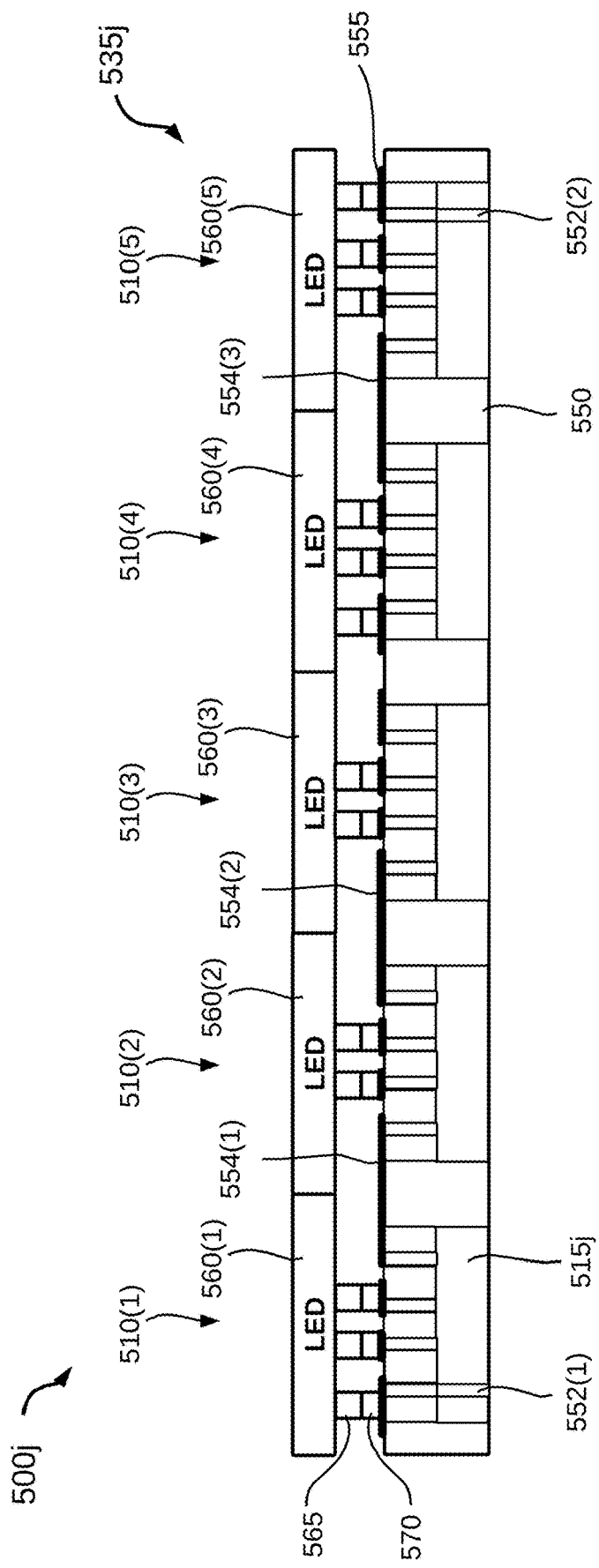
Figure 5K:
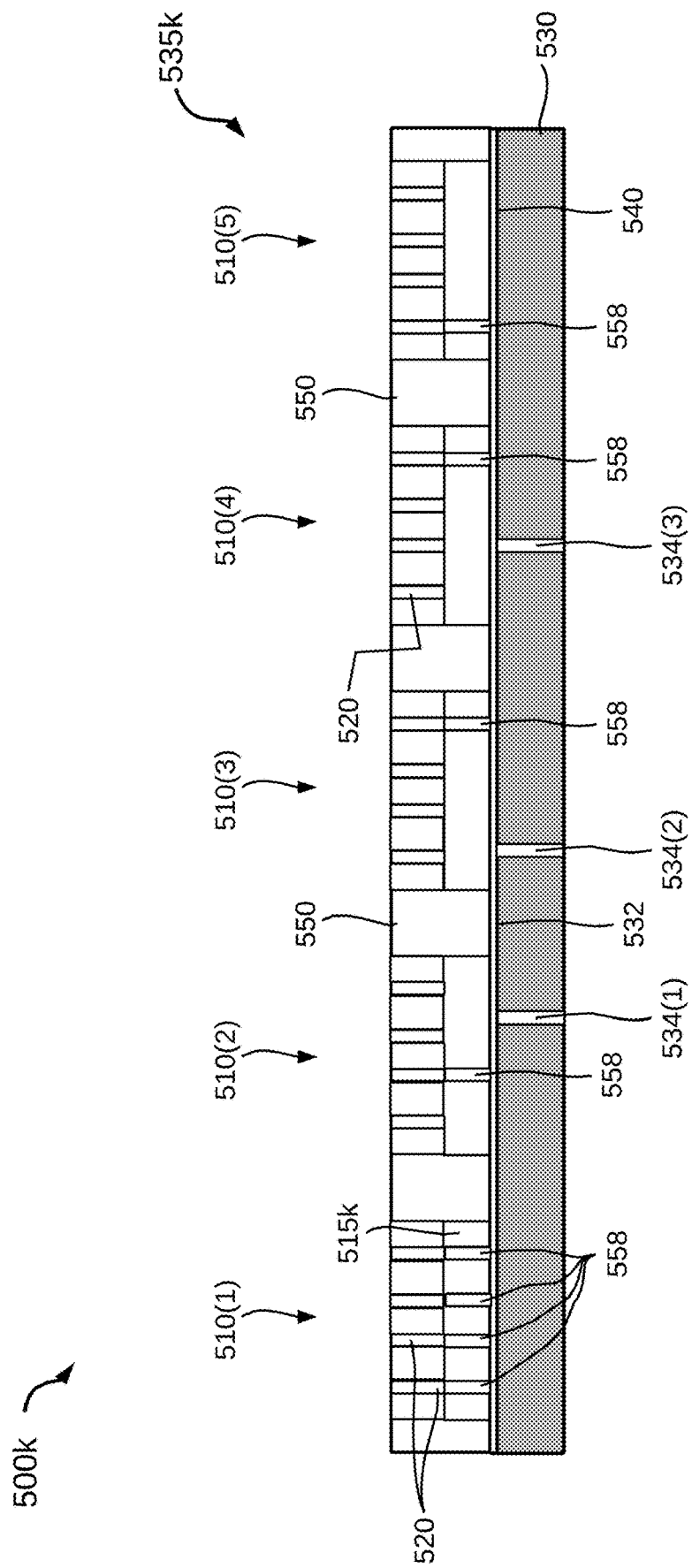

Diagrams 500j and 500k shown in FIGS. 5J and 5K, respectively, are partial cross-sectional views of tiles 535j, 535k. Tiles 535j, 535k include example electrical connections between LED arrays 560, CMOS backplane dies 510, and optionally, an adhesive layer 540 and substrate 530, Referring initially to FIG. 5J, tile 535j includes a plurality of LED arrays 560 electrically coupled to a plurality of CMOS backplane dies 510 using a RDL 555 disposed therebetween. The patterning of the RDL 555 is such that portions of the RDL (i.e., connectors 554) may extend between different CMOS backplane dies. For example, connector 554(1) of RDL 555 electrically couples a first CMOS backplane die 510(1) to a second CMOS backplane die 510(2). Similarly, connector 554(2) of RDL 555 electrically couples the second CMOS backplane die 510(2) to a third CMOS backplane die 510(3). Additional CMOS backplane dies may be similarly interconnected using additional connectors in the RDL. Thus, by patterning the RDL such that connections bridge across different backplane dies, backplane dies 510(2), 510(3), 510(4), as well as their associated LED arrays, that are centrally positioned within the tile may be electrically addressed (e.g., from electrical connectors 330 of the tile).

Referring to FIGS. 5J and 5K together, CMOS backplane dies 510 are illustrated having base portions 515j, 515k, respectively. The base portions 515j, 515k may be a silicon material. In the embodiments shown in diagrams 500j, 500k, the base portions 515j, 515k may include one or more through-silicon vias (TSV) 552 that provide electrical connectivity to the CMOS backplane die 510 and/or, in certain embodiments, that may extend from a bottom side of the base portion 515j, 515k to one or more of the conductive pillars (e.g., pillars 520 in FIG. 5A). The TSVs 552 are formed from an electrically conductive material and are configured to receive electrical current or signals (e.g., from a different electrical connector, from a power source, or from a control module) and deliver the current or signal, directly or indirectly through intervening connectors, to one or more LED arrays 560.

Diagram 500k in FIG. 5K shows additional TSVs 534 extending through (e.g., between top and bottom sides of) the substrate 530. Tile 353K may have more or fewer TSV 534 in substrate 530 without departing from the scope of the present disclosure. In some embodiments, the bottom side of TSV 534 (i.e., the side furthest from CMOS backplane dies 510) may electrically couple with a power source or another electrical conduit within the display assembly. The top side of TSV 534 (i.e., the side nearest the CMOS backplane dies 510) may couple directly to one or more TSVs 558 within a base portion 515k of CMOS backplane dies 510. Alternatively or additionally, the top side of TSV 534 may couple with a RDL or other printed circuitry to distribute electrical current before delivering it to one or more TSVs 558 within the CMOS backplane dies 510. In embodiments where printed circuitry is disposed on the top side of the substrate 530, adhesive layer 540 may be contoured or otherwise selectively applied such that printed circuitry is not covered by the adhesive layer. In some embodiments, the printed circuitry may be formed from a material having both conductive and adhesive properties, such as a conductive epoxy or an anisotropic conductive film (ACF) selectively applied to create electrical connections.

Figure 6A:
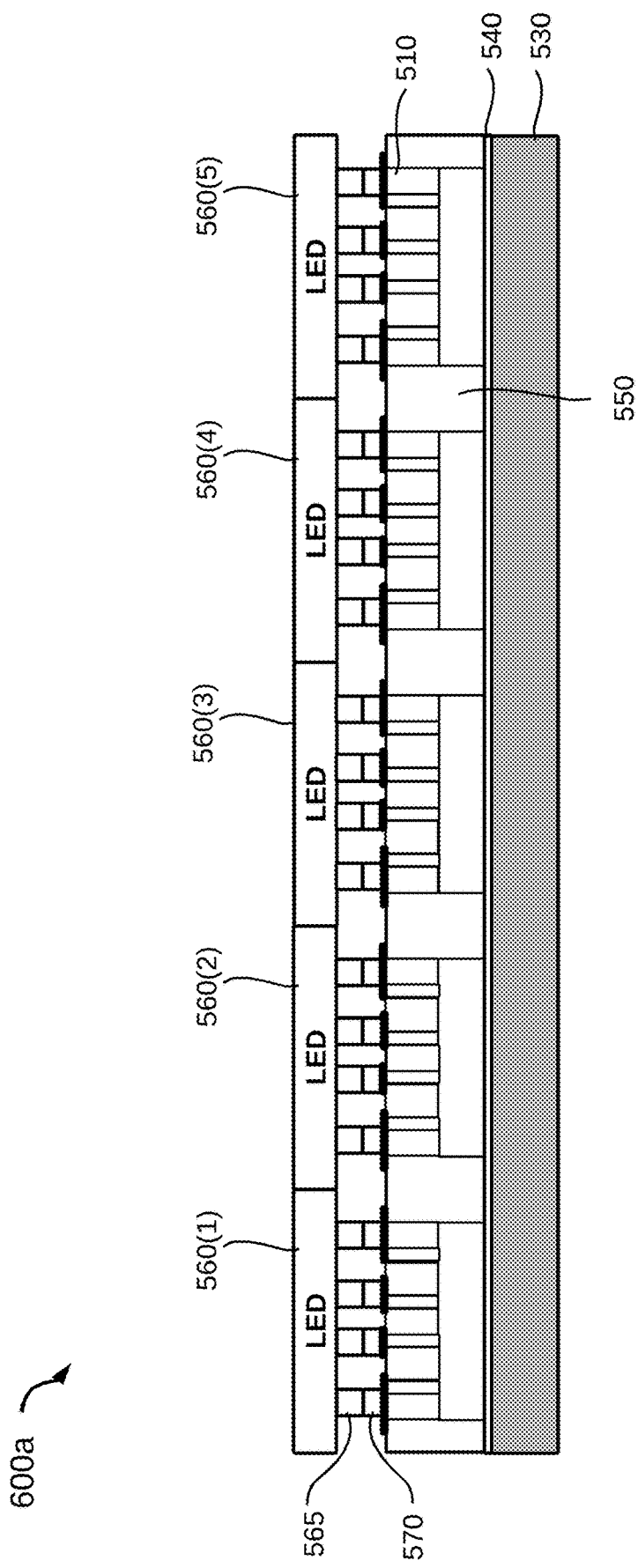
FIGS. 6A and 6B illustrate an example of forming assemblies using panel level packaging (PLP), in accordance with aspects of this disclosure.
Figure 6B:
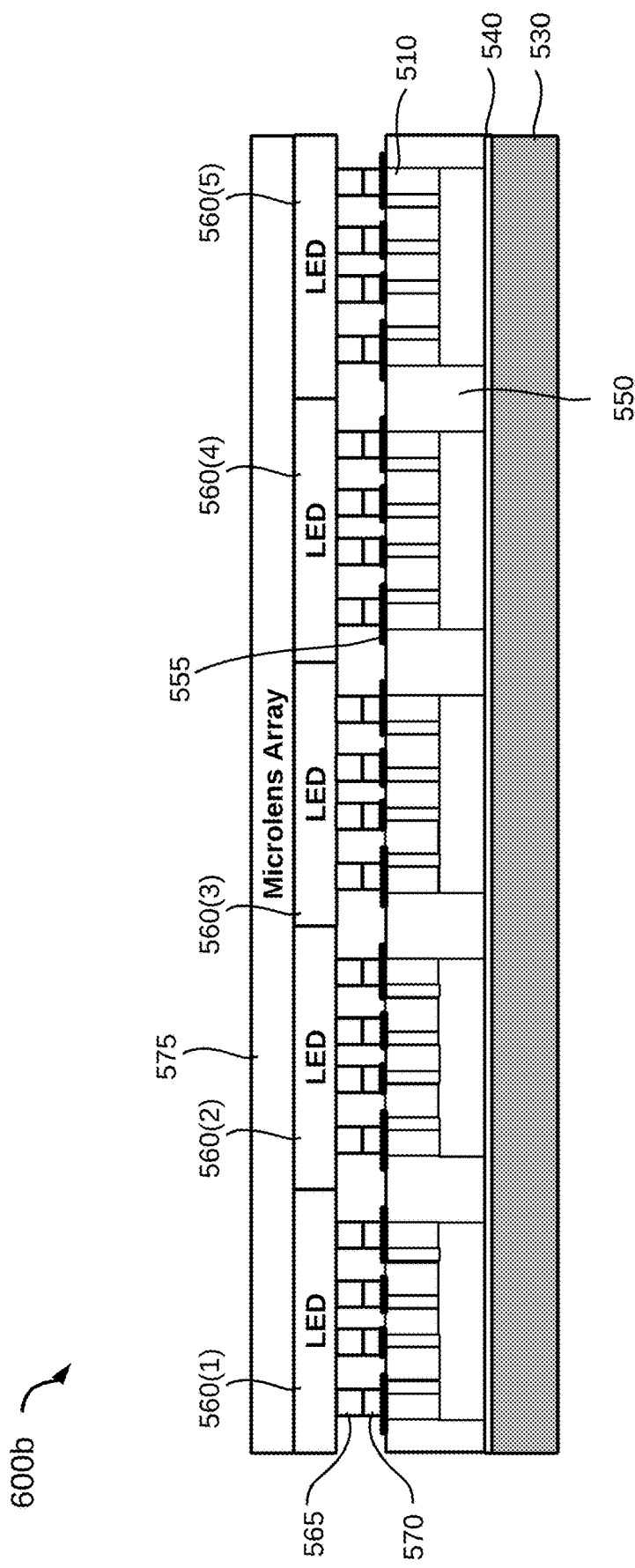

FIGS. 6A and 6B show diagrams 600a and 600b, respectively, that illustrate examples of forming assemblies using panel level packaging (PLP), in accordance with aspects of this disclosure. Unlike the examples in FIGS. 5A-5K, in which a reconstructed wafer is formed and then diced or cut into one or more tiles, the diagrams 600a and 600b show where a single panel is formed over a substrate 530 (which is not removed) by using the adhesive layer 540 to hold the CMOS backplane dies 510, depositing the RDL 555, flip chip bonding the LED arrays 560 using electrical contacts or connections 565 and 570, and then placing one or more microlens arrays 575 on top (e.g., FIG. 6B). The materials and/or processes for making a single panel using PLP may be the same or similar to those used to make a reconstructed wafer from which tiles are diced in WLP: however, the PLP assembly may be larger in size than tiles formed using WLP and may be square or rectangular in shape. PLP may therefore be used to make a single panel backplane assembly or a single panel display assembly that has not only the backplane electronics but also the light elements and/or optical elements. The assembly formed using PLP may include electrical connectors (not shown) around the periphery of the assembly.

FIGS. 7A-7E illustrate examples of different configurations of CMOS backplane dies, LED arrays, and microlens arrays for WLP and PLP, in accordance with aspects of this disclosure. As described above, there may be different correspondences between the CMOS backplane dies, the LED arrays, and the microlens arrays.

Figure 7A:
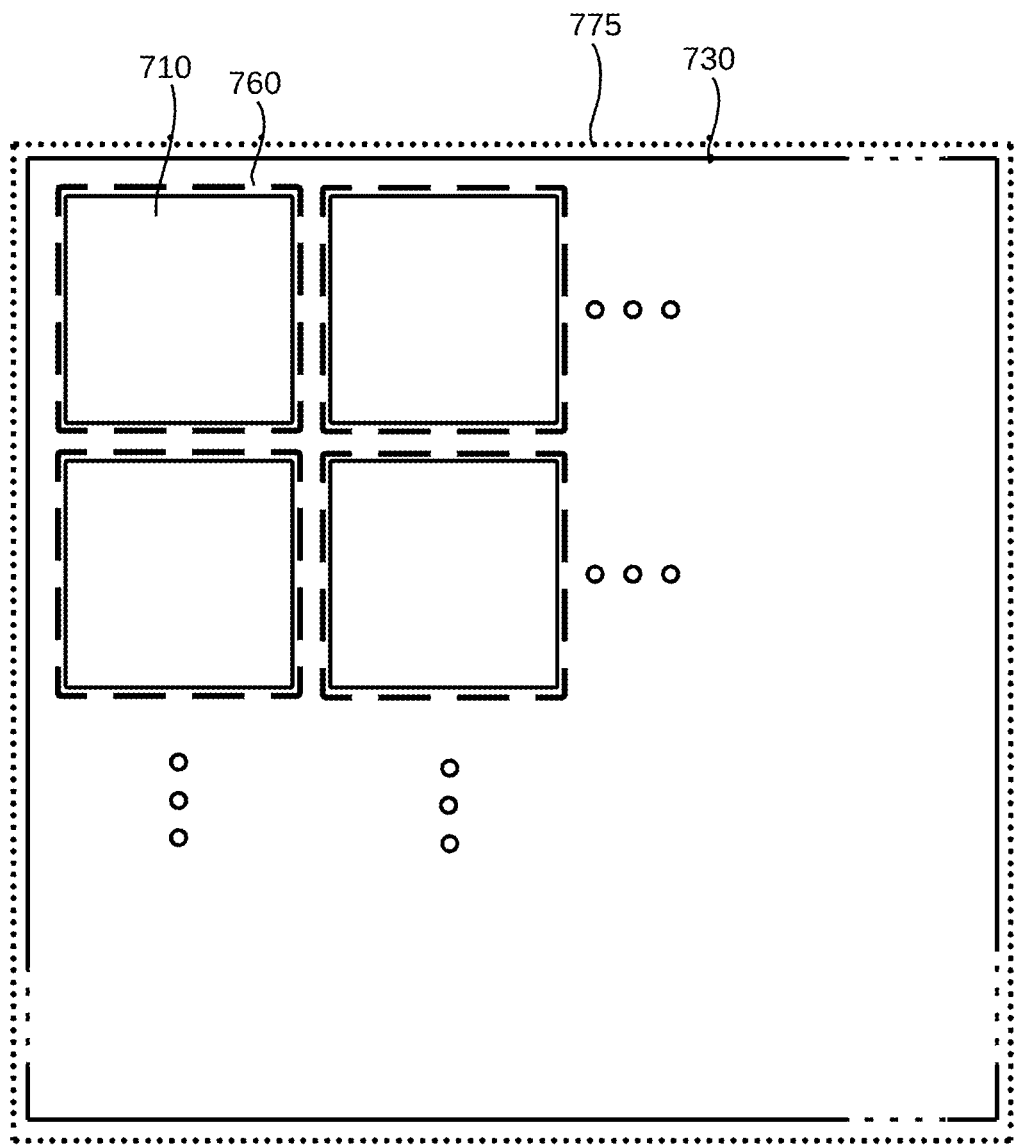
FIGS. 7A-7E illustrate examples of different configurations of CMOS backplane dies, LED arrays, and microlens arrays for WLP and PLP, in accordance with aspects of this disclosure.

A diagram 700a in FIG. 7A is a top view showing a configuration or implementation for a tile (e.g., diced or cut tile from a reconstructed wafer) or panel 730 including multiple CMOS backplanes dies 710 arranged in an array and each CMOS backplane die 710 has a corresponding LED array 760 (indicated by a dashed line) positioned thereon. In addition, a single microlens array 775 covers the entire set of CMOS backplane dies 710 and LED arrays 760 on panel 730. Whereas in the 2×2 array of tiles as shown in FIG. 3A allows connection of two sides of each tile with electrical connectors at the edges of the backplane, all but the dies 710 of FIG. 7A that have one or more edges along a perimeter of the array cannot be directly connected with electrical connectors (not shown) at the edges of panel 730. Thus, in order to electrically address the dies of FIG. 7A that do not have an edge along a perimeter of the array, each CMOS backplane die 710 is electrically connected with adjacent CMOS backplane dies. Thus, all of the CMOS backplane dies 710 of panel 730 may be electrically addressed from electrical connectors (not shown) at the edges of panel 730. Alternatively, or in addition, electrical connections to one or more CMOS backplane die may be provided, for example, through panel 730 by using vias (not shown) or other mechanisms for forming electrical connections. The electrical connections may be provided using conventional methods, such as wire bonding.

Figure 7B:
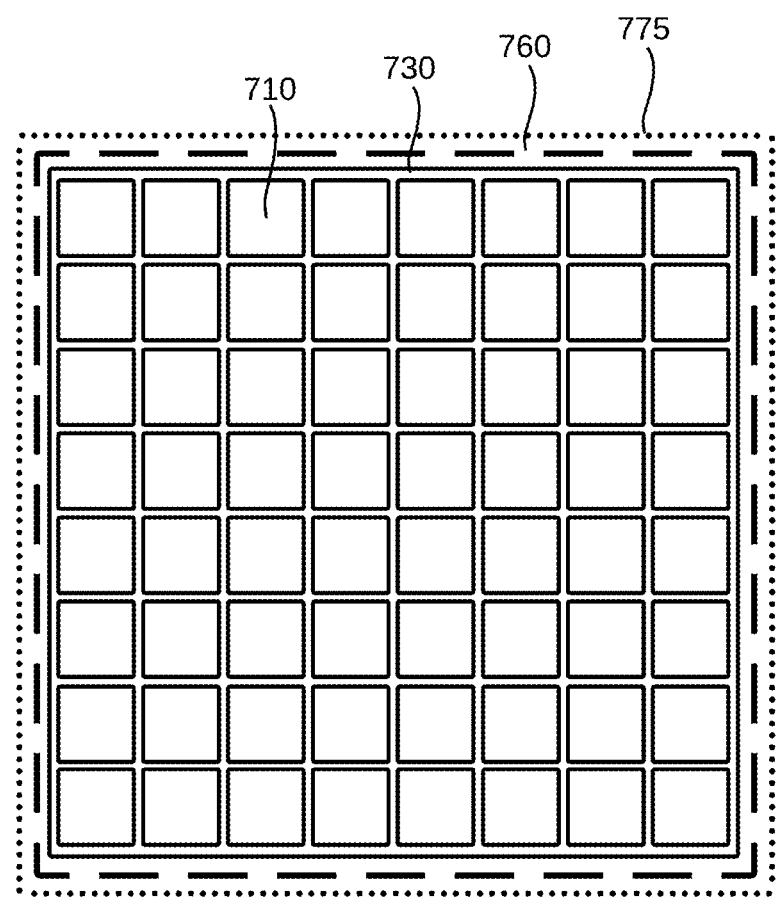

A diagram 700b in FIG. 7B shows an example configuration for a tile or panel 730 in which there are multiple CMOS backplanes dies 710 arranged in an array (e.g., 8×8 array) and a single corresponding LED array 760 over the CMOS backplane dies 710. In addition, there is a single microlens array 775 that covers the entire set of CMOS backplane dies 710 and the LED array 760.

Figure 7C:
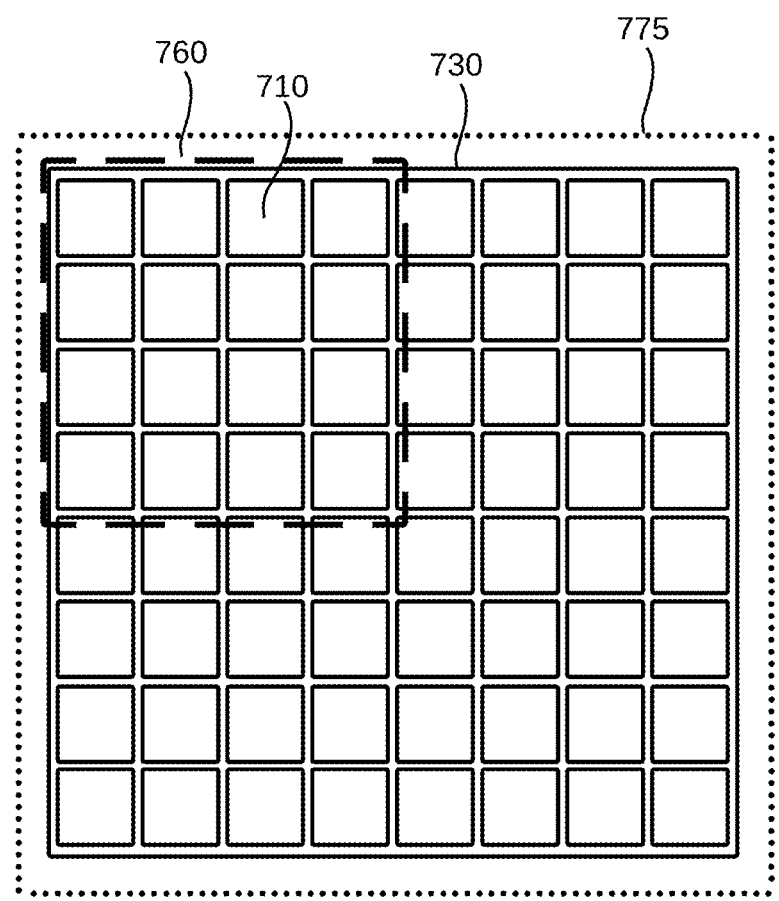

A diagram 700c in FIG. 7C shows another example configuration for a tile or panel 730 in which there are multiple CMOS backplanes dies 710 arranged in an array (e.g., 8×8 array) and multiple LED arrays 760 over the CMOS backplane dies 710 arranged in a different array (e.g., 2×2 array). In this example, each LED array 760 covers a subset of the CMOS backplane dies 710 (e.g. a 4×4 array of CMOS backplane dies 710). While each LED array 760 may cover the same number of CMOS backplane dies 710, this need not be the case. In addition, there is a single microlens array 775 that covers the entire set of CMOS backplane dies 710 and the LED arrays 760.

Figure 7D:
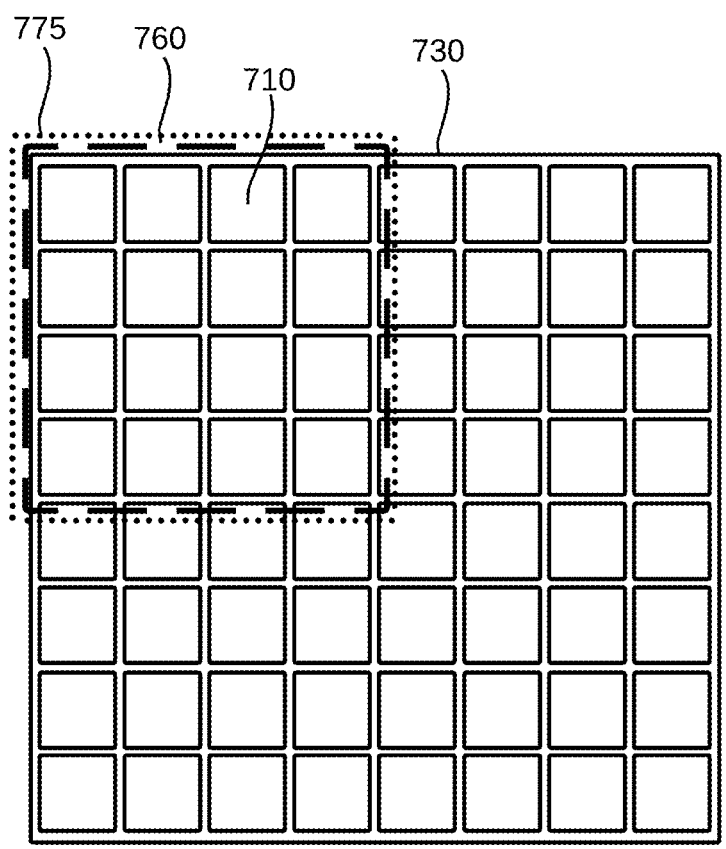

A diagram 700d in FIG. 7D shows yet another possible configuration or implementation for a tile or panel 730 in which there are multiple CMOS backplanes dies 710 arranged in an array (e.g., 8×8 array) and multiple LED arrays 760 over the CMOS backplane dies 710 arranged in a different array (e.g., 2×2 array). In this example, each LED array 760 covers a subset of the CMOS backplane dies 710 (e.g. a 4×4 array of CMOS backplane dies 710). While each LED array 760 may cover the same number of CMOS backplane dies 710, this need not be the case. In addition, there may be multiple microlens arrays 775. In this example, there is a microlens array 775 for each LED array 760 (e.g., a 2×2 array of microlens arrays 775), but that need not be the case.

Figure 7E:
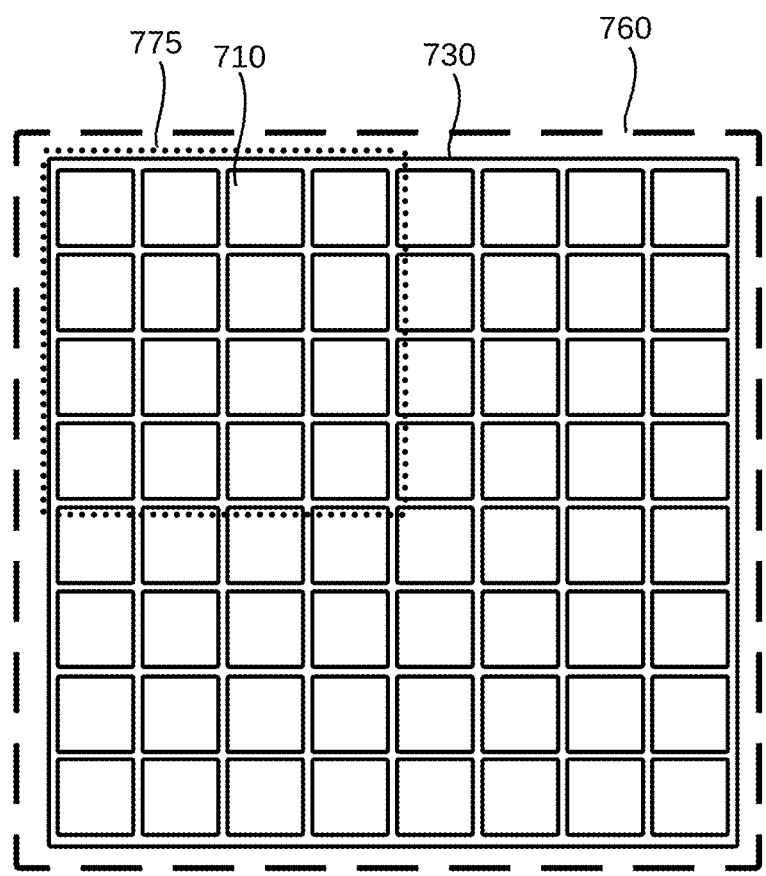

A diagram 700e in FIG. 7E shows another configuration or implementation for a tile or panel 730 in which there are multiple CMOS backplanes dies 710 arranged in an array (e.g., 8×8 array) and a single LED array 760 over the CMOS backplane dies 710. In addition, there may be multiple microlens arrays 775 that cover the entire set of CMOS backplane dies 710 and the LED array 760. In this example, the microlens arrays 775 are arranged in a different array (e.g., 2×2 array) than the CMOS backplane dies 710, and each microlens array 775 covers a subset of the CMOS backplane dies 710 (e.g. a 4×4 array of CMOS backplane dies 710).

Figure 8A:
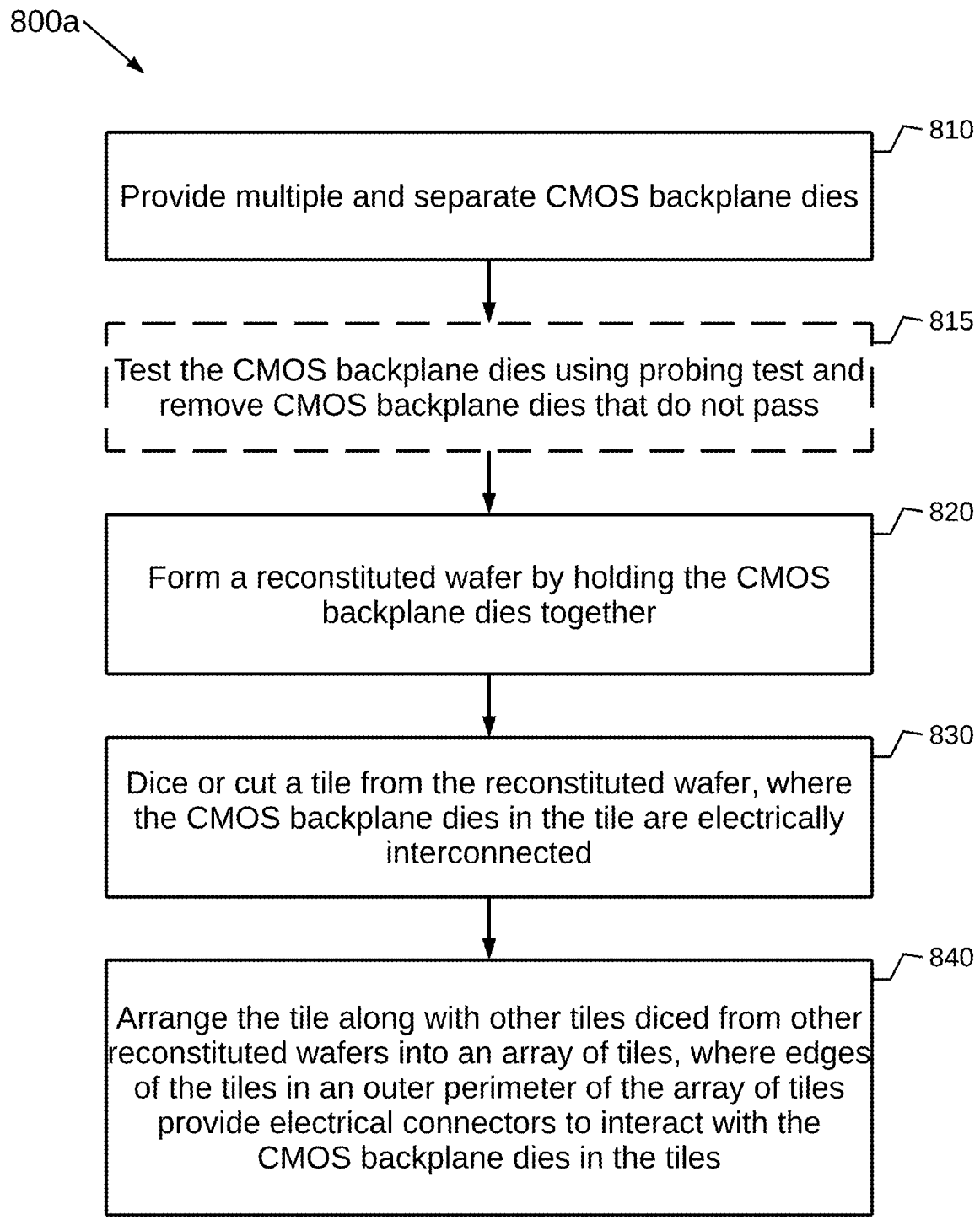
FIGS. 8A and 8B are flow charts that illustrate different methods of manufacturing or fabricating a backplane for controlling light provided by a display, in accordance with aspects of this disclosure.
Figure 8B:
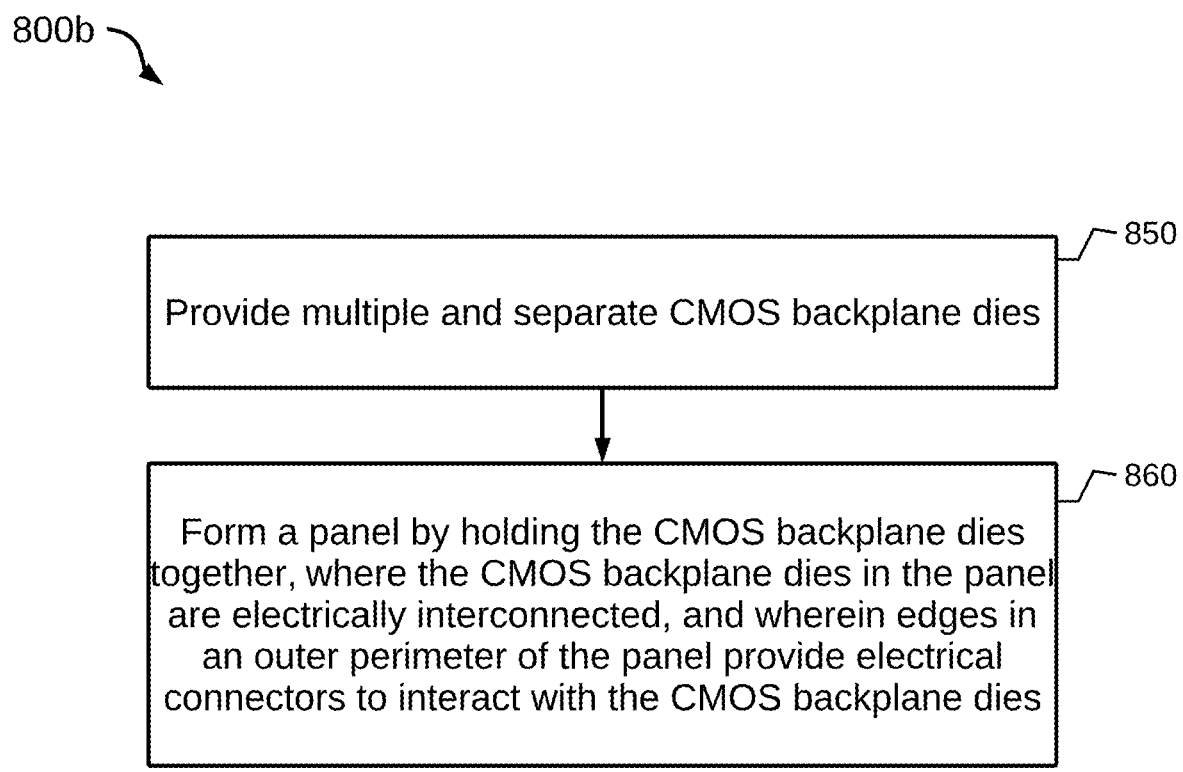

FIGS. 8A and 8B are flow charts that illustrate different methods of manufacturing or fabricating a backplane for controlling light provided by a display, in accordance with aspects of this disclosure.

The method 800a in FIG. 8A corresponds to a method of manufacturing a backplane for controlling light provided by a display.

The method 800a includes at 810 providing multiple and separate CMOS backplane dies.

The method 800a optionally includes at 815 testing the CMOS backplane dies using a probing test and removing ones of the CMOS backplane dies that do not pass the test.

The method 800a includes at 820 forming a reconstructed wafer by holding the CMOS backplane dies together. The plurality of CMOS backplane dies may be held in a fixed position relative to each other using an adhesive layer disposed on a rigid substrate. The CMOS backplane dies and substrate assembly may be handled by standard processing equipment, rather than customized equipment, during subsequent processing steps in order to reduce fabrication costs. Further processing steps may include depositing an overmold layer, removing a portion of the overmold layer to expose electrically conductive pillars, depositing an electrical redistribution layer (RDL), and placing LED or DMD panels over the RDL.

The method 800a includes at 830 dicing a tile from the wafer (also referred to herein as a "reconstructed wafer"), where the CMOS backplane dies in the tile are electrically connected with each other.

The method 800a includes at 840 arranging the tile along with other tiles diced from other reconstructed wafers into an array of tiles, where edges of the tiles in an outer perimeter of the array of tiles provide electrical connections to interact with the CMOS backplane dies in the tiles.

In an aspect of the method 800a, each CMOS backplane die is a CMOS integrated circuit configured to provide signals to control one or more respective subsets of light emitting elements or light reflecting elements within the display assembly.

In an aspect of the method 800a, each CMOS backplane die has passed a wafer level probing test before it is included into its respective tile.

In an aspect of the method 800a, the reconstructed wafer is formed over a substrate, and the method 800a further includes removing the reconstituted wafer from the substrate by performing a wafer scale laser lift off (LLO) process that separates the reconstituted wafer from the substrate.

In an aspect of the method 800a, the reconstructed wafer is formed using a substrate, and the substrate remains part of the reconstructed wafer after tiles are fixed thereto and dicing is completed.

In an aspect of the method 800a, the reconstructed wafer is formed over a substrate, and the CMOS backplane dies are held in place in the reconstructed wafer by being permanently attached to the substrate.

In an aspect of the method 800a, the CMOS backplane dies in each tile are held together with an overmold, the CMOS backplane dies are positioned die up, and forming the reconstructed wafer further includes removing a top portion of the overmold to expose electrical pillars of the CMOS backplane dies to electrical interconnections between the CMOS backplane dies and an electrical redistribution layer. Moreover, removing of the top portion of the overmold includes grinding, etching, or otherwise removing the top portion of the overmold.

In an aspect of the method 800a, the CMOS backplane dies in each tile are held together with an overmold, and the method 800a further includes disposing the overmold at least in between and around the CMOS backplane dies and curing the overmold to form a portion of the reconstructed wafer, the overmold being made of a material containing silica, alumina, graphite, a ceramic, a polymer, or an electronic molding compound. The polymer may include polyimide or epoxy.

In an aspect of the method 800a, a size of the tile diced from the reconstructed wafer is in a range from 4 inches up to 18 inches. In some embodiments, the diced tile may be approximately 11 inches. Other tile sizes are also possible without departing from the scope of the present disclosure.

In an aspect of the method 800a, the tile diced from the reconstructed wafer is a rectangular tile or a square tile.

In an aspect of the method 800a, the reconstructed wafer is of a standard size for wafer level processing, the standard size being one of a 150 mm wafer size, a 200 mm wafer size, a 300 mm wafer size, or a 450 mm wafer size.

In an aspect of the method 800a, the array of tiles is arranged over a rigid substrate.

In an aspect of the method 800a, the array of tiles is arranged over a flexible substrate.

The method 800b in FIG. 8B corresponds to another method of manufacturing a backplane for controlling light provided by a display.

The method 800b includes at 850, providing multiple and separate CMOS backplane dies.

The method 800b includes at 860, forming a panel by holding the CMOS backplane dies together, wherein the CMOS backplane dies in the panel are electrically interconnected, and wherein edges in an outer perimeter of the panel provide electrical connectors to interact with the CMOS backplane dies.

In an aspect of the method 800b, forming the panel includes holding the CMOS backplane dies together by bonding the CMOS backplane dies onto a substrate.

In an aspect of the method 800b, forming the panel includes holding the CMOS backplane dies together with an overmold.

In an aspect of the method 800b, forming the panel includes attaching the CMOS backplane dies onto a substrate and holding the CMOS backplane dies together with an overmold. The method 800b may further include removing the panel with the CMOS backplane dies from the substrate by performing a laser lift off (LLO) process that separates the panel from the substrate. Moreover, removing the panel from the substrate may include using a thermal, laser, or UV releasable layer between the panel and the substrate.

In an aspect of the method 800b, each CMOS backplane die is a CMOS integrated circuit configured to provide signals to control a respective subset of light emitting elements or light reflecting elements of the display.

In an aspect of the method 800b, each CMOS backplane die has passed a wafer level probing test before it is included into the panel.

In an aspect of the method 800b, the CMOS backplane dies are positioned die up, and forming the panel includes holding the CMOS backplane dies together with an overmold and removing a top portion of the overmold to expose electrical pillars of the CMOS backplane dies. Moreover, removing of the top portion of the overmold includes grinding the top portion of the overmold. Additionally, the electrical pillars of the CMOS backplane dies are exposed to electrical interconnections between the CMOS backplane dies and an electrical redistribution layer.

In an aspect of the method 800b, forming the panel includes holding the CMOS backplane dies together with an overmold, the method 800b further including disposing the overmold at least in between and around the CMOS backplane dies and curing the overmold to form the panel, the overmold being made of a material containing silica, alumina, graphite, a ceramic, a polymer, or an electronic molding compound. The polymer may include polyimide or epoxy.

The present disclosure describes various techniques and devices that enable larger and more dense assemblies for backplanes and displays that may be used with high resolution displays, such as light field displays.

The following claims are intended to cover all generic and specific features described herein, as well as all statements of the scope of the present method and system, which, as a matter of language, might be said to fall therebetween. In particular, the following embodiments are specifically contemplated, as well as any combinations of such embodiments that are compatible with one another:

(A) A backplane for controlling a display and including a plurality of tiles formed into an array, each tile including a plurality of complementary metal-oxide-semiconductor (CMOS) backplane dies where edges of the tiles forming an outer perimeter of the array have electrical connections that direct electrical signals to at least one of the CMOS backplane dies.

(B) In the backplane denoted as (A), at least one of the CMOS backplane dies including a CMOS integrated circuit that generates at least one electrical signal to drive at least one light emitting element of the display.

(C) In either of the baclplanes denoted as (A) or (B), each CMOS backplane die including a CMOS integrated circuit for generating an electrical signal to at least one light reflecting element of the display (D) In any of the backplanes denoted as (A)-(C), when the plurality of tiles are formed as a 2×2 array, each tile having two edges each with electrical connections at the outer perimeter of the array.

(E) In any of the backplanes denoted as (A)-(D), ones of the plurality of CMOS backplane dies positioned at the edges of the tile providing external electrical connectivity to the remaining CMOS backplane dies of the tile.

(F) In any of the backplanes denoted as (A)-(E), the plurality of CMOS backplane dies being arranged in a rectangular or square array and each of the plurality of CMOS backplane dies includes a plurality of pillars that electrically connect, via an electrical redistribution layer (RDL), with at least one LED array of the display.

(G) In any of the backplanes denoted as (A)-(F), each of the plurality of tiles further including an overmold filling gaps between CMOS backplane dies and holding the plurality of CMOS backplane dies together.

(H) In any of the backplanes denoted as (A)-(G), the overmold being formed from a material selected from a group consisting of silica, alumina, graphite, a ceramic, and a polymer.

(I) In any of the backplanes denoted as (A)-(H), each of the plurality of tiles further including a substrate for securely supporting the plurality of CMOS backplane dies.

(J) In any of the backplanes denoted as (A)-(I), the substrate being rigid and including a plurality of through-silicon-vias (TSVs) providing electrical connectivity to at least one of the plurality of CMOS backplane dies.

(K) A display assembly including a backplane having an array of tiles, each tile having a plurality of electrically coupled CMOS backplane dies, where edges of the tiles forming an outer perimeter of the array include electrical connections directing electrical signals to one or more of the plurality of CMOS backplane dies, and at least one light emitting diode (LED) array electrically coupled with at least one tile.

(L) In the display assembly denoted as (K), each of the plurality of tiles further including an electrical redistribution layer disposed on at least a portion of each of the plurality of CMOS backplane dies to electrically connect pillars of at least one of the CMOS backplane dies to the at least one LED array.

(M) Either of the display assemblies denoted as (K) or (L), further including at least one microlens array configured to refract light from the LED array.

(N) In any of the display assemblies denoted as (K)-(M), the at least one microlens array including a single microlens array that covers the array of tiles.

(O) In any of the display assemblies denoted as (K)-(N), the at least one microlens array including a plurality of microlens arrays, where each of the plurality of microlens arrays covers a different tile of the array of tiles.

(P) In any of the display assemblies denoted as (K)-(O), the at least one microlens array including a plurality of microlens arrays, and wherein each of the plurality of microlens arrays covers a single CMOS backplane die.

(Q) In any of the display assemblies denoted as (K)-(P), each tile of the array of tiles further including a substrate rigidly supporting the plurality of CMOS backplane dies.

(R) In any of the display assemblies denoted as (K)-(M), the substrate further including a plurality of through-silicon-vias (TSVs) providing electrical connectivity to at least one of the plurality of CMOS backplane dies.

(S) In any of the display assemblies denoted as (K)-(R), each tile of the array of tiles further including an overmold filling gaps between CMOS backplane dies therein and rigidly supporting the CMOS backplane dies.

Accordingly, although the present disclosure has been provided in accordance with the implementations shown, one of ordinary skill in the art will readily recognize that there could be variations to the embodiments and those variations would be within the scope of the present disclosure. Therefore, many modifications may be made by one of ordinary skill in the art without departing from the scope of the appended claims.

The invention claimed is:

1. A backplane for controlling a display, the backplane comprising:
a plurality of electrical connectors disposed around at least a portion of a perimeter of the backplane;
a plurality of tiles formed into a tile array on the backplane, the plurality of tiles including a tile on a perimeter of the tile array and connected to an electrical connector of the plurality of electrical connectors; and
a plurality of backplane dies arranged in a die array on the tile, the plurality of backplane dies including:
a first backplane die having an edge on a perimeter of the die array, and
a second backplane die adjacent to the first backplane die and without an edge on the perimeter of the die array, the second backplane die connecting to the electrical connector by way of the first backplane die.

2. The backplane of claim 1, wherein a backplane die of the plurality of backplane dies comprises a complementary metal-oxide-semiconductor (CMOS) integrated circuit that generates an electrical signal to drive a light emitting element of the display.

3. The backplane of claim 1, wherein a backplane die of the plurality of backplane dies comprises a complementary metal-oxide-semiconductor (CMOS) integrated circuit for generating an electrical signal to a light reflecting element of the display.

4. The backplane of claim 1, when the plurality of tiles are formed as a 2×2 tile array, each tile having two edges each with electrical connections at the perimeter of the tile array.

5. The backplane of claim 1, wherein the first backplane die of the plurality of backplane dies provides external electrical connectivity to a remainder of backplane dies in the die array on the tile.

6. The backplane of claim 1, wherein the plurality of backplane dies are arranged in a rectangular or square die array and a backplane die of the plurality of backplane dies includes a plurality of pillars that electrically connect, via an electrical redistribution layer (RDL), with an LED array of the display.

7. The backplane of claim 1, wherein the tile includes an overmold configured to fill gaps between the plurality of backplane dies and to hold the plurality of backplane dies together.

8. The backplane of claim 7, wherein the overmold is formed from at least one of a silica material, an alumina material, a graphite material, a ceramic material, or a polymer material.

9. The backplane of claim 1, wherein the tile includes a substrate for securely supporting the plurality of backplane dies.

10. The backplane of claim 9, the substrate being rigid and comprising a plurality of through-silicon-vias (TSVs) providing electrical connectivity to at least one of the plurality of backplane dies.

11. A display assembly, comprising:
a backplane comprising:
a plurality of electrical connectors disposed around at least a portion of a perimeter of the backplane, an array of tiles including a tile on a perimeter of the array of tiles and connected to an electrical connector of the plurality of electrical connectors, and a plurality of electrically coupled backplane dies arranged in a die array on the tile, the plurality of backplane dies including:
- a first backplane die having an edge on a perimeter of the die array, and
- a second backplane die adjacent to the first backplane die and without an edge on the perimeter of the die array, the second backplane die connecting to the electrical connector by way of the first backplane die; and a light emitting diode (LED) array electrically coupled with the tile.

12. The display assembly of claim 11, wherein the tile includes an electrical redistribution layer disposed on at least a portion of each of the first backplane die and the second backplane die to electrically connect pillars of at least one of the first backplane die or the second backplane die to the LED array.

13. The display assembly of claim 11, further comprising at least one microlens array configured to refract light from the LED array.

14. The display assembly of claim 13, wherein the at least one microlens array comprises a single microlens array that covers the array of tiles.

15. The display assembly of claim 13, wherein the at least one microlens array comprises a plurality of microlens arrays, where each of the plurality of microlens arrays covers a different tile of the array of tiles.

16. The display assembly of claim 13, wherein the at least one microlens array comprises a plurality of microlens arrays, and wherein each of the plurality of microlens arrays covers a single backplane die of the plurality of backplane dies.

17. The display assembly of claim 11, wherein the tile includes a substrate rigidly supporting the plurality of backplane dies.

18. The display assembly of claim 17, the substrate further comprising a plurality of through-silicon-vias (TSVs) providing electrical connectivity to at least one of the plurality of backplane dies.

19. The display assembly of claim 11, wherein the tile includes an overmold configured to fill gaps between the plurality of backplane dies and to rigidly support the plurality of backplane dies.

20. The display assembly of claim 19, wherein the overmold is formed from at least one of a silica material, an alumina material, a graphite material, a ceramic material, or a polymer material.

* * * * *